United States Patent
Yoshida et al.

(10) Patent No.: US 11,046,886 B2
(45) Date of Patent: Jun. 29, 2021

(54) METHOD FOR PRODUCING LIQUID COMPOSITION

(71) Applicant: Sumitomo Chemical Company, Limited, Tokyo (JP)

(72) Inventors: Sadamu Yoshida, Tokyo (JP);
Hidenobu Kakimoto, Osaka (JP);
Hisaaki Miyamoto, Osaka (JP);
Takahiro Ueoka, Tsukuba (JP);
Nobuchika Iwata, Toyonaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/631,065

(22) PCT Filed: Sep. 10, 2018

(86) PCT No.: PCT/JP2018/033514
§ 371 (c)(1),
(2) Date: Jan. 14, 2020

(87) PCT Pub. No.: WO2019/054341
PCT Pub. Date: Mar. 21, 2019

(65) Prior Publication Data
US 2020/0199444 A1    Jun. 25, 2020

(30) Foreign Application Priority Data

Sep. 14, 2017 (JP) .............................. JP2017-177038

(51) Int. Cl.
*C09K 11/06*   (2006.01)
*B01D 71/34*   (2006.01)
(Continued)

(52) U.S. Cl.
CPC .............. *C09K 11/06* (2013.01); *B01D 61/16* (2013.01); *B01D 61/18* (2013.01); *B01D 71/34* (2013.01); *B01D 71/36* (2013.01); *H01L 51/5016* (2013.01)

(58) Field of Classification Search
CPC ....... C09K 11/06; C09K 11/02; C09K 11/025; C09K 11/07; C09K 11/59; H01L 51/5016;
(Continued)

(56) References Cited

U.S. PATENT DOCUMENTS 5,490,926 A * 2/1996 Hammeken ............ B01D 35/30
210/321.74
5,642,718 A    7/1997 Nakai et al.
(Continued)

FOREIGN PATENT DOCUMENTS

JP    S59173106 A    10/1984
JP    H09032678 A    2/1997
(Continued)

OTHER PUBLICATIONS

Office Action dated Mar. 24, 2020 in TW Application No. 107132273.
(Continued)

*Primary Examiner* — Joseph W Drodge
(74) *Attorney, Agent, or Firm* — Panitch Schwarze Belisario & Nadel LLP

(57) ABSTRACT

A method for producing a liquid composition formed of a phosphorescent material and an organic solvent includes the steps of: dissolving a phosphorescent material in an organic solvent to prepare a mixed liquid, and filtering the mixed liquid by a filtering device. The filtering device is a housing or holder, a fluororesin membrane filter, and a filter support member. A material of a portion of the housing and holder in contact with the mixed liquid is a metal or a mixture of metal and at least one of glass, fluororesins, polyethylene not
(Continued)

containing a phosphorus antioxidant, and polyethylene not containing an oxidized phosphorus antioxidant. A material of a portion of the filter support member in contact with the mixed liquid is at least one of metals, glass, fluororesins, polyethylene not containing a phosphorus antioxidant, and polyethylene not containing an oxidized phosphorus antioxidant.

5 Claims, 1 Drawing Sheet

(51) Int. Cl.
B01D 71/36 (2006.01)
H01L 51/50 (2006.01)
B01D 61/16 (2006.01)
B01D 61/18 (2006.01)

(58) Field of Classification Search
CPC . H01L 51/0003; H01L 51/0025; H01L 51/56; H01L 51/0085; H01L 39/00; H01L 39/24; H01L 51/50; H01L 2221/00; H01L 2221/67; H01L 2221/683; H01L 2221/68381; H05B 33/14; H05B 33/10; B01D 61/20; B01D 71/34; B01D 71/36; B01D 2313/20; B01D 71/32; B01D 61/14; B01D 61/142; B01D 61/145; B01D 61/147; B01D 61/16; B01D 61/18; B01D 2311/04; B01D 2311/26
USPC .......... 210/500.36, 500.42, 644, 650, 651; 257/40; 438/82, 99
See application file for complete search history.

(56) References Cited

U.S. PATENT DOCUMENTS

| | | | |
|---|---|---|---|
| 7,455,792 B2* | 11/2008 | Yoshimoto | C08G 73/0266 252/500 |
| 7,553,355 B2* | 6/2009 | Torres, Jr. | B01J 20/06 116/206 |
| 2002/0182441 A1* | 12/2002 | Lamansky | C07F 15/0086 428/690 |
| 2003/0116788 A1* | 6/2003 | Sakakibara | C09K 11/06 257/200 |
| 2004/0048101 A1* | 3/2004 | Thompson | H01L 51/0077 428/690 |
| 2005/0258441 A1 | 11/2005 | Shitagami | |
| 2006/0108279 A1* | 5/2006 | Kloos | B01D 67/0088 210/500.21 |
| 2007/0180993 A1* | 8/2007 | Byun | B01D 71/32 96/7 |
| 2009/0066223 A1 | 3/2009 | Yabe et al. | |
| 2009/0302742 A1 | 12/2009 | Komori et al. | |
| 2010/0187977 A1 | 7/2010 | Kai et al. | |
| 2011/0118411 A1 | 5/2011 | Anryu et al. | |
| 2011/0171447 A1* | 7/2011 | Krishnamoorthy | H01L 21/02137 428/220 |
| 2011/0272686 A1 | 11/2011 | Ohuchi et al. | |
| 2011/0303908 A1* | 12/2011 | Min | C08G 61/02 257/40 |
| 2012/0068170 A1 | 3/2012 | Pflumm et al. | |
| 2012/0238105 A1 | 9/2012 | Anemian et al. | |
| 2013/0270545 A1 | 10/2013 | Tanaka et al. | |
| 2015/0021587 A1 | 1/2015 | Mizukami et al. | |
| 2015/0140715 A1 | 5/2015 | Imamura et al. | |
| 2015/0380681 A1* | 12/2015 | Furukawa | H01L 51/5253 257/40 |
| 2016/0043325 A1 | 2/2016 | Gorohmaru et al. | |
| 2016/0192501 A1* | 6/2016 | Yan | H05K 3/0073 29/846 |
| 2017/0186989 A1 | 6/2017 | Hosono et al. | |
| 2017/0200908 A1 | 7/2017 | Yoshida et al. | |
| 2017/0237036 A1* | 8/2017 | Ueoka | C08G 61/126 257/40 |
| 2017/0312693 A1* | 11/2017 | Masuda | B01D 63/067 |

FOREIGN PATENT DOCUMENTS

| | | |
|---|---|---|
| JP | 2002066228 A | 3/2002 |
| JP | 2002305095 A | 10/2002 |
| JP | 2006004907 A | 1/2006 |
| JP | 2008200925 A | 9/2008 |
| JP | 2009227663 A | 10/2009 |
| JP | 2009249400 A | 10/2009 |
| JP | 2010189630 A | 9/2010 |
| JP | 2010275255 A | 12/2010 |
| JP | 2012036388 A | 2/2012 |
| JP | 2012043912 A | 3/2012 |
| JP | 2013026164 A | 2/2013 |
| JP | 2013047315 A | 3/2013 |
| JP | 2015063662 A | 4/2015 |
| JP | 2015099679 A | 5/2015 |
| JP | 2016029635 A | 3/2016 |
| TW | 201144355 A | 12/2011 |
| TW | 201351744 A | 12/2013 |
| TW | I440692 B | 6/2014 |
| WO | 2007063754 A1 | 6/2007 |
| WO | 2008056746 A1 | 5/2008 |
| WO | 2009131255 A1 | 10/2009 |
| WO | 2010136109 A1 | 12/2010 |
| WO | 2011032686 A1 | 3/2011 |
| WO | 2011147523 A1 | 12/2011 |
| WO | 2012096263 A1 | 7/2012 |
| WO | 2016043231 | 3/2016 |
| WO | 2016136008 A1 | 9/2016 |

OTHER PUBLICATIONS

Extended European Search Report dated May 25, 2020 in EP Application No. 18855901.7.
Pall et al., "Chemical Compatibility (continued) Filter Housing Materials," PALL.LIFE, 1 page. (Outside, May 6, 2013).
Saunders et al., "Chemical Compatibility of Filter Components," J. Polymer Science: Chemistry edition, J. Polymer Science: Polymer Physics, MilliporeSigma Data Sheet References, pp. 1791-1798 (Aug. 1, 2018).
International Search Report dated Nov. 27, 2018 in International Application No. PCT/JP2018/033514.

* cited by examiner

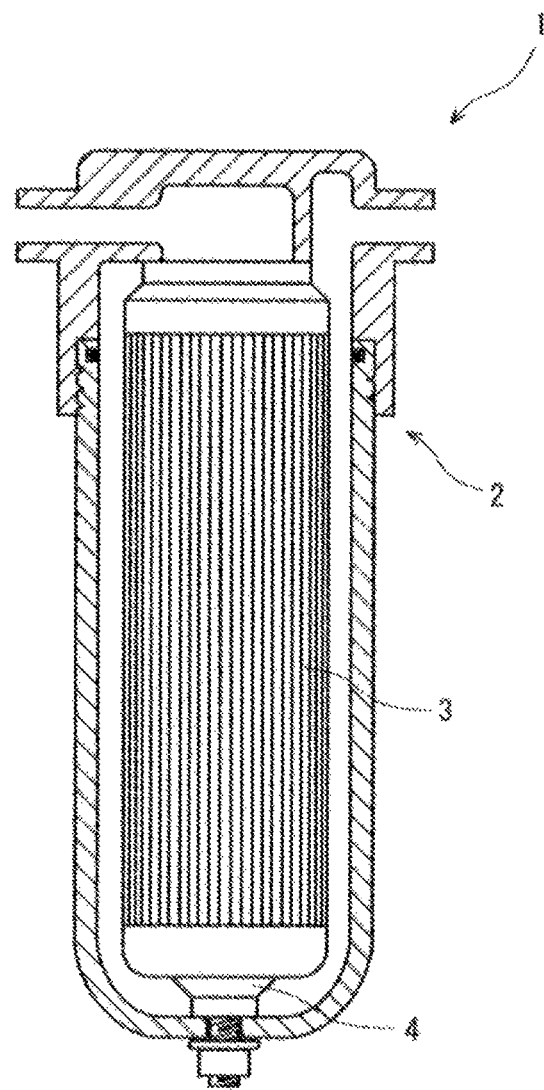

METHOD FOR PRODUCING LIQUID COMPOSITION

CROSS-REFERENCE TO RELATED APPLICATION

This application is a Section 371 of International Application No. PCT/JP2018/033514, filed Sep. 10, 2018, which was published in the Japanese language on Mar. 21, 2019, under International Publication No. WO 2019/054341 A1, which claims priority under 35 U.S.C. § 119(b) to Japanese Application No. 2017-177038, filed Sep. 14, 2017, the disclosures of all of which are incorporated herein by reference in their entirety.

TECHNICAL FIELD

The present invention relates to a method for producing a liquid composition.

BACKGROUND ART

The light-emitting layer of organic electroluminescence (hereinafter also referred to as "organic EL") devices is formed by, for example, applying a liquid composition containing an organic EL material to a pixel electrode. When a liquid composition containing an organic EL material is applied to a pixel electrode, uneven coating may occur if solids are contained in the liquid composition. Further, when a liquid composition containing an organic EL material is applied by an inkjet method, nozzle clogging may occur due to solids in the liquid composition.

In order to prevent such uneven coating and nozzle clogging, there has been proposed a method for producing an organic EL liquid composition that comprises a step of pressure-filtering a solution of an organic EL material in an organic solvent through a filter having a pore diameter of 0.03 to 0.10 µm (see Patent Literature (PTL) 1).

CITATION LIST

Patent Literature

PTL 1: JP2013-26164A

SUMMARY OF INVENTION

Technical Problem

However, when the above production method is used and if the constituent member of a filtering device in a portion in contact with the filtrate comprises a phosphorus antioxidant, the liquid composition after filtration contains eluates of the phosphorus antioxidant and oxidized phosphorus antioxidant. This may cause a decrease in luminance lifetime of an organic EL device produced.

Furthermore, if a non-conductive material is used as a housing or a holder of a filtering device, and when a mixed liquid obtained by dissolving all the solute in an organic solvent is filtered, static electricity is likely to accumulate in the filtering device due to friction between the mixed liquid and the inner wall of the housing or of the holder and thus cause defects. If the filtration speed is lowered in order to inhibit the accumulation of static electricity, the filtration takes a long time, which significantly reduces the productivity.

Accordingly, an object of the present invention is to provide a method capable of producing a liquid composition with high productivity, the composition not causing nozzle clogging or uneven coating and not containing eluted substances that cause a decrease in luminance lifetime.

Solution to Problem

The present invention provides the following production methods described in [1] to [5].

[1] A method for producing a liquid composition comprising a phosphorescent material and an organic solvent, the method comprising the steps of:
dissolving a phosphorescent material in an organic solvent to prepare a mixed liquid, and
filtering the mixed liquid obtained in the above step by a filtering device;
wherein the filtering device comprises a housing or holder, a fluororesin membrane filter, and a filter support member;
a material of a portion of the housing and holder, the portion being in contact with the mixed liquid, is a metal alone or a mixture of a metal and at least one member selected from the group consisting of glass, fluororesins, polyethylene not containing a phosphorus antioxidant, and polyethylene not containing an oxidized phosphorus antioxidant; and
a material of a portion of the filter support member, the portion being in contact with the mixed liquid, is at least one member selected from the group consisting of metals, glass, fluororesins, polyethylene not containing a phosphorus antioxidant, and polyethylene not containing an oxidized phosphorus antioxidant.

[2] The method for producing a liquid composition according to [1] above, wherein a material of the fluororesin membrane filter is polytetrafluoroethylene or polyvinylidene fluoride.

[3] The method for producing a liquid composition according to [1] or [2] above, wherein the fluororesin membrane filter has a pore diameter of 0.01 µm or more and 1 µm or less.

[4] The method for producing a liquid composition according to any one of [1] to [3] above, wherein the material of a portion of the housing and holder, the portion being in contact with the mixed liquid, is a mixture of stainless steel and a fluororesin.

[5] A method for producing a light-emitting device, the method comprising a step of applying a liquid composition produced by the method for producing a liquid composition according to any one of [1] to [4] above to form a light-emitting layer.

Advantageous Effects of Invention

According to the present invention, a liquid composition that does not cause uneven coating or nozzle clogging and that does not contain eluted substances that cause a decrease in luminance lifetime can be produced with high productivity.

BRIEF DESCRIPTION OF DRAWINGS

FIG. 1 is a schematic diagram showing an example of a filtering device used in the present invention.

DESCRIPTION OF EMBODIMENTS

1. Explanation of Common Terms

The terms used in the present specification and claims are explained below.

Me represents a methyl group, Et represents an ethyl group, i-Pr represents an isopropyl group, n-Bu represents an n-butyl group, and t-Bu represents a tert-butyl group.

The "polymer compound" refers to a polymer having a molecular weight distribution and a polystyrene-equivalent number average molecular weight of $1\times10^3$ to $1\times10^8$. The constitutional unit contained in the polymer compound is 100 mol % in total.

The "low-molecular-weight compound" refers to a compound having no molecular weight distribution and a molecular weight of $1\times10^4$ or less.

The "constitutional unit" refers to one or more units present in the polymer compound.

The "halogen atom" refers to a fluorine atom, a chlorine atom, a bromine atom, or an iodine atom.

The "amino group" may have a substituent, and a substituted amino group is preferable. The substituent that the amino group has is preferably an alkyl group, an aryl group, or a monovalent heterocyclic group.

Examples of the substituted amino group include dialkylamino groups, such as dimethylamino and diethylamino groups; and diarylamino groups, such as diphenylamino, bis(4-methylphenyl)amino, bis(4-tert-butylphenyl)amino, and bis(3,5-di-tert-butylphenyl)amino groups.

The "alkyl group" refers to a linear, branched, or cyclic alkyl group. The number of carbon atoms in the liner alkyl group is generally 1 to 50, preferably 1 to 30, and more preferably 1 to 20. The number of carbon atoms in the branched and cyclic alkyl groups is generally 3 to 50, preferably 3 to 30, and more preferably 4 to 20. Examples of the alkyl group include methyl, ethyl, n-propyl, isopropyl, n-butyl, isobutyl, tert-butyl, n-pentyl, isoamyl, 2-ethylbutyl, n-hexyl, cyclohexyl, n-heptyl, cyclohexylmethyl, cyclohexylethyl, n-octyl, 2-ethylhexyl, 3-n-propylheptyl, n-decyl, 3,7-dimethyloctyl, 2-ethyloctyl, 2-n-hexyl-decyl, and n-dodecyl groups.

The "alkyl group" may have a substituent. Examples of the substituent include a halogen atom (particularly a fluorine atom), a cyano group, an aryl group (the aryl group may have 1 to 3 substituents selected from the group consisting of an alkyl group and an alkoxy group), a monovalent heterocyclic group, an alkoxy group, an aryloxy group, a substituted amino group, and the like. The "alkyl group" may have 1 to 20 substituents selected from these substituents. Examples of the substituted alkyl group include trifluoromethyl, pentafluoroethyl, perfluorobutyl, perfluorohexyl, perfluorooctyl, 3-phenylpropyl, 3-(4-methylphenyl)propyl, 3-(3,5-di-n-hexylphenyl)propyl, and 6-ethyloxyhexyl groups.

The "alkoxy group" refers to a linear, branched, or cyclic alkoxy group. The number of carbon atoms in the linear alkoxy group is generally 1 to 40, and preferably 1 to 10. The number of carbon atoms in the branched and cyclic alkoxy groups is generally 3 to 40, and preferably 4 to 10. Examples of the alkoxy group include methoxy, ethoxy, n-propyloxy, isopropyloxy, n-butyloxy, isobutyloxy, tert-butyloxy, n-pentyloxy, n-hexyloxy, cyclohexyloxy, n-heptyloxy, n-octyloxy, 2-ethylhexyloxy, n-nonyloxy, n-decyloxy, 3,7-dimethyloctyloxy, and lauryloxy groups.

The "alkoxy group" may have a substituent. Examples of the substituent include a halogen atom (particularly a fluorine atom), a cyano group, an aryl group (the aryl group may have 1 to 3 substituents selected from the group consisting of an alkyl group and an alkoxy group), a monovalent heterocyclic group, an alkoxy group, an aryloxy group, a substituted amino group, and the like. The "alkoxy group" may have 1 to 10 substituents selected from these substituents.

The "aryl group" refers to a monovalent group obtained by removing, from an aromatic hydrocarbon, one hydrogen atom directly bonded to a carbon atom constituting the ring. The number of carbon atoms in the aryl group is generally 6 to 60, preferably 6 to 20, and more preferably 6 to 10. Examples of the aryl group include phenyl, 1-naphthyl, 2-naphthyl, 1-anthracenyl, 2-anthracenyl, 9-anthracenyl, 1-pyrenyl, 2-pyrenyl, 4-pyrenyl, 2-fluorenyl, 3-fluorenyl, and 4-fluorenyl groups.

The "aryl group" may have a substituent. Examples of the substituent include a halogen atom (particularly a fluorine atom), a cyano group, an aryl group (the aryl group may have 1 to 3 substituents selected from the group consisting of an alkyl group and an alkoxy group), a monovalent heterocyclic group, an alkoxy group, an aryloxy group, a substituted amino group, and the like. The "aryl group" may have 1 to 10 substituents selected from these substituents. Examples of the substituted aryl group include 2-phenylphenyl, 3-phenylphenyl, and 4-phenylphenyl groups.

The "aryloxy group" refers to a monovalent group obtained by replacing one hydrogen atom directly bonded to a carbon atom constituting the ring of an aromatic hydrocarbon by an oxygen atom. The number of carbon atoms in the aryloxy group is generally 6 to 60, and preferably 6 to 48. Examples of the aryloxy group include phenoxy, 1-naphthyloxy, 2-naphthyloxy, 1-anthracenyloxy, 9-anthracenyloxy, and 1-pyrenyloxy groups.

The "aryl" in the "aryloxy group" may have a substituent. Examples of the substituent include a halogen atom (particularly a fluorine atom), a cyano group, an alkyl group, an aryl group (the aryl group may have 1 to 3 substituents selected from the group consisting of an alkyl group and an alkoxy group), a monovalent heterocyclic group, an alkoxy group, an aryloxy group, a substituted amino group, and the like. The "aryl" may have 1 to 10 substituents selected from these substituents. Examples of the substituted aryloxy group include 2-phenylphenoxy, 3-phenylphenoxy, and 4-phenylphenoxy groups.

The "arylene group" refers to a divalent group obtained by removing, from an aromatic hydrocarbon, two hydrogen atoms directly bonded to carbon atoms constituting the ring. The number of carbon atoms in the arylene group is generally 6 to 60, preferably 6 to 30, and more preferably 6 to 18. Examples of the arylene group include phenylene, naphthalenediyl, anthracenediyl, phenanthrenediyl, dihydrophenanthenediyl, naphthacenediyl, fluorenediyl, pyrenediyl, perylenediyl, and chrysenediyl groups.

The "arylene group" may have a substituent. Examples of the substituent include a halogen atom (particularly a fluorine atom), a cyano group, an alkyl group, an aryl group (the aryl group may have 1 to 5 substituents selected from the group consisting of an alkyl group, an alkoxy group, a phenyl group, and an alkylphenyl group), a monovalent heterocyclic group, an alkoxy group, an aryloxy group, a substituted amino group, an alkylene group (dimethylene, trimethylene, etc.), and the like. The "arylene group" may have 1 to 5 substituents selected from these substituents. Preferable examples of the arylene group that may have such a substituent include groups represented by formulas (A-1) to (A-20):

(A-1) 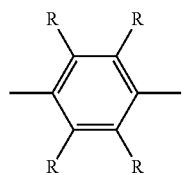
(A-2) 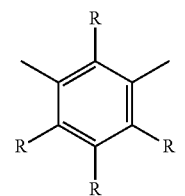
(A-3) 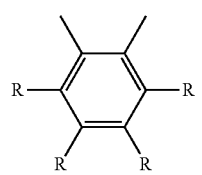
(A-4) 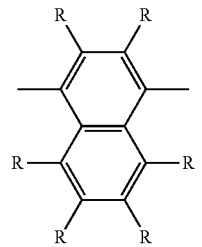
(A-5) 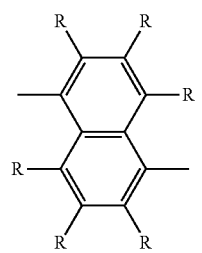
(A-6) 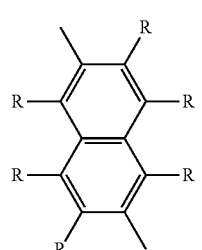
(A-7) 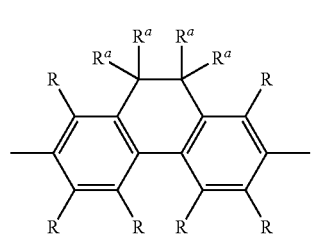
(A-8) 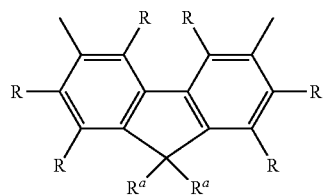
(A-9) 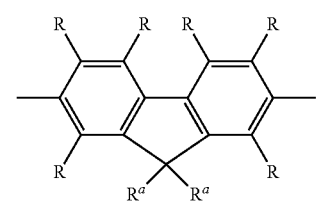
(A-10) 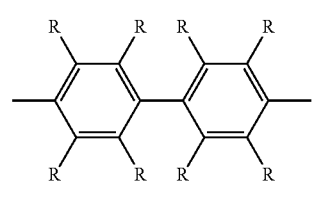
(A-11) 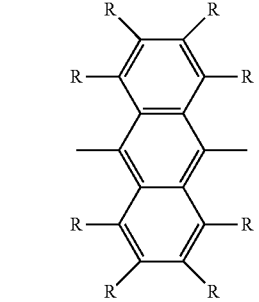
(A-12) 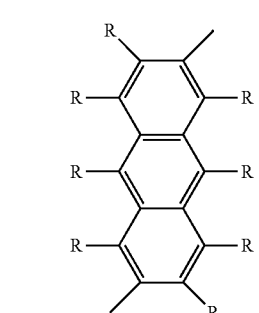
(A-13) 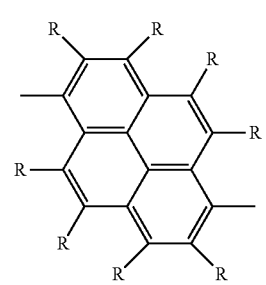

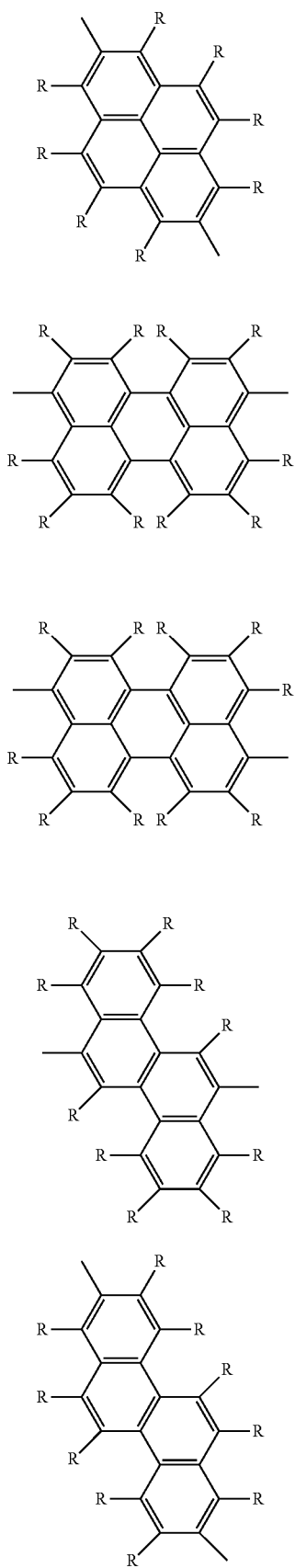

wherein R and R$^a$ each independently represent a hydrogen atom, a halogen atom, a cyano group, an alkyl group, an aryl group (the aryl group may have 1 to 5 substituents selected from the group consisting of an alkyl group, an alkoxy group, a phenyl group, and an alkylphenyl group), a monovalent heterocyclic group, an alkoxy group, an aryloxy group, or a substituted amino group; a plurality of R and R$^a$ may be the same or different; and adjacent R$^a$ may be bonded to each other to form a ring together with the carbon atoms to which they are bonded.

When adjacent R$^a$ are bonded to each other to form a ring together with the carbon atoms to which they are bonded, examples of the group in which the two R$^a$ are bonded to each other include an alkylene group, a 2,2'-biphenylene group (the 2,2'-biphenylene group may have 1 to 5 alkyl groups), and the like.

The "p-valent heterocyclic group" (p represents an integer of 1 or more; in particular, p is 1 or 2) refers to a p-valent group obtained by removing p-number of hydrogen atoms among hydrogen atoms directly bonded to carbon atoms or heteroatoms constituting the ring of a heterocyclic compound. Preferable among p-valent heterocyclic groups are "p-valent aromatic heterocyclic groups," which are p-valent groups obtained by removing p-number of hydrogen atoms among hydrogen atoms directly bonded to carbon atoms or heteroatoms constituting the ring of an aromatic heterocyclic compound.

Examples of the "aromatic heterocyclic compound" include compounds whose heterocycles themselves are aromatic, such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzosilole, and dibenzophosphole; compounds whose heterocycles themselves are not aromatic, but are condensed with aromatic rings, such as phenoxazine, phenothiazine, dibenzoborol, dibenzosilol, and benzopyran; and compounds in which a plurality of these compounds are bonded together.

The number of carbon atoms in the p-valent heterocyclic group is generally 2 to 60, and preferably 3 to 20.

The "p-valent heterocyclic group" may have a substituent. Examples of the substituent include a halogen atom (particularly a fluorine atom), a cyano group, an alkyl group, an aryl group (the aryl group may have 1 to 5 substituents selected from the group consisting of an alkyl group, an alkoxy group, a phenyl group, and an alkylphenyl group), a monovalent heterocyclic group, an alkoxy group, an aryloxy group, a substituted amino group, an alkylene group (dimethylene, trimethylene, etc.), and the like. The "p-valent heterocyclic group" may have 1 to 10 substituents selected from these substituents.

The number of carbon atoms in the monovalent heterocyclic group is generally 2 to 60, preferably 3 to 20, and more preferably 4 to 20.

Examples of the "monovalent heterocyclic group" include thienyl, pyrrolyl, furyl, pyridyl, piperidyl, quinolyl, isoquinolyl, pyrimidinyl, and triazinyl groups.

The "monovalent heterocyclic group" may have a substituent. Examples of the substituent include a halogen atom (particularly a fluorine atom), a cyano group, an alkyl group, an aryl group (the aryl group may have 1 to 5 substituents selected from the group consisting of an alkyl group, an alkoxy group, a phenyl group, and an alkylphenyl group), a monovalent heterocyclic group, an alkoxy group, an aryloxy group, a substituted amino group, an alkylene group (dimethylene, trimethylene, etc.), and the like. The "monovalent heterocyclic group" may have 1 to 5 substituents selected from these substituents.

The number of carbon atoms in the divalent heterocyclic group is generally 2 to 60, preferably 3 to 20, and more preferably 4 to 15.

Examples of the "divalent heterocyclic group" include a divalent group obtained by removing two hydrogen atoms among hydrogen atoms directly bonded to carbon atoms or heteroatoms constituting the ring of an aromatic heterocyclic compound (e.g., pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole, triazole, oxazole, oxadiazole, thiazole, or thiadiazole), and a divalent group in which a plurality of (e.g., 2 to 4) groups selected from the group consisting of the above divalent groups are bonded.

The "divalent heterocyclic group" may have a substituent. Examples of the substituent include a halogen atom (particularly a fluorine atom), a cyano group, an alkyl group, an aryl group (the aryl group may have 1 to 5 substituents selected from the group consisting of an alkyl group, an alkoxy group, a phenyl group, and an alkylphenyl group), a monovalent heterocyclic group, an alkoxy group, an aryloxy group, a substituted amino group, an alkylene group (dimethylene, trimethylene, etc.), and the like. The "divalent heterocyclic group" may have 1 to 5 substituents selected from these substituents. Preferable examples of the divalent heterocyclic group that may have such a substituent include groups represented by formulas (A-21) to (A-52):

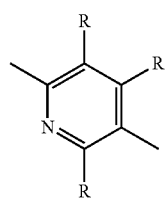
(A-21)

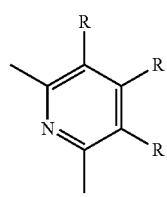
(A-22)

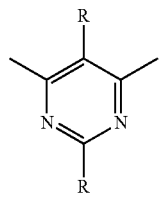
(A-23)

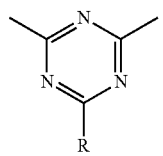
(A-24)

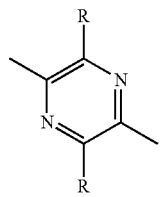
(A-25)

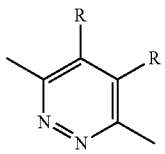
(A-26)

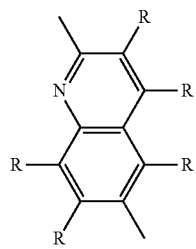
(A-27)

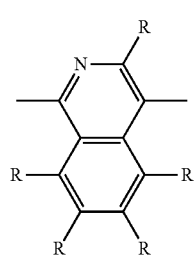
(A-28)

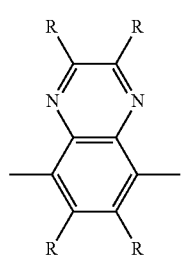
(A-29)

(A-30) 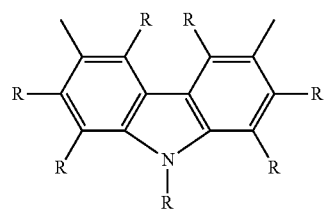
(A-31) 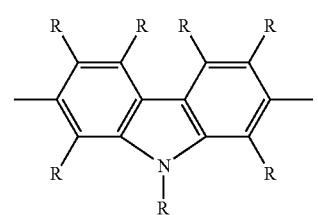
(A-32) 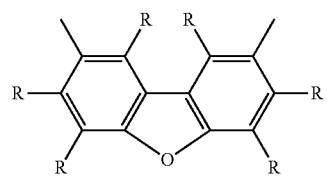
(A-33) 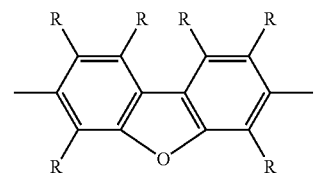
(A-34) 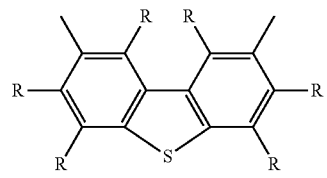
(A-35) 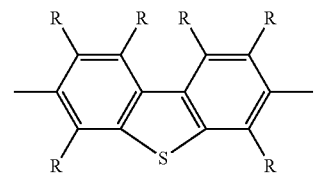
(A-36) 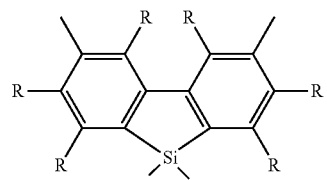
(A-37) 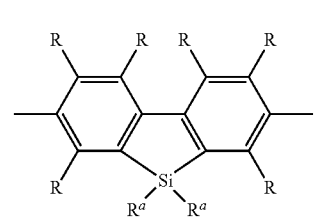
(A-38) 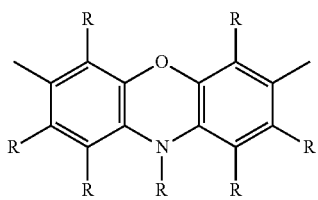
(A-39) 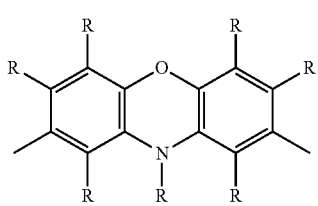
(A-40) 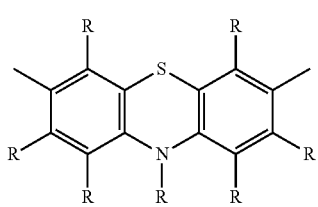
(A-41) 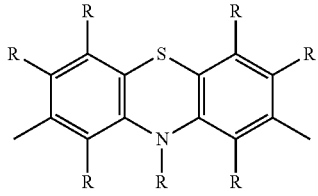
(A-42) 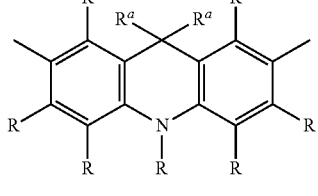
(A-43) 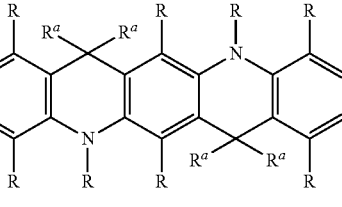
(A-44) 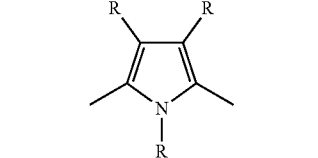
(A-45) 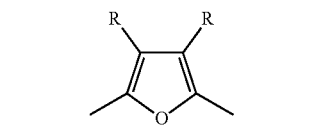

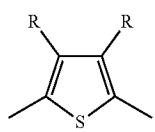 (A-46)

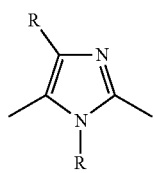 (A-47)

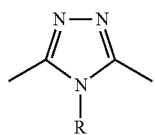 (A-48)

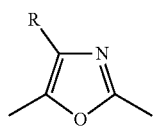 (A-49)

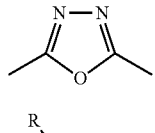 (A-50)

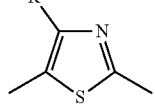 (A-51)

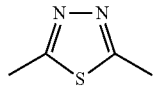 (A-52)

wherein R and $R^a$ have the same meanings as described above.

The "substituent" refers to a halogen atom, a cyano group, an alkyl group, an aryl group, a monovalent heterocyclic group, an alkoxy group, an aryloxy group, an amino group, or a substituted amino group.

The "crosslinkable groups" refer to groups represented by formulas (B-1) to (B-17):

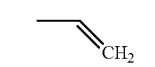 (B-1)

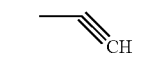 (B-2)

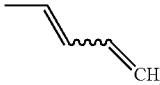 (B-3)

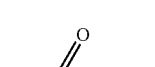 (B-4)

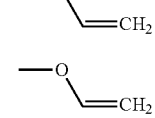 (B-5)

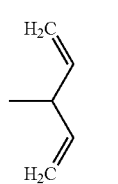 (B-6)

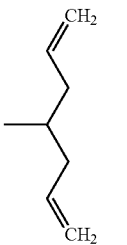 (B-7)

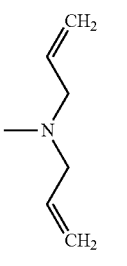 (B-8)

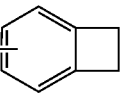 (B-9)

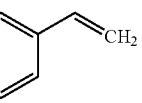 (B-10)

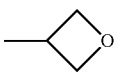 (B-11)

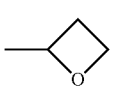 (B-12)

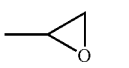 (B-13)

 (B-14)

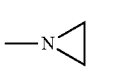 (B-15)

—$N_3$ (B-16)

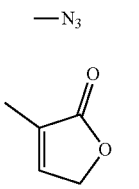 (B-17)

wherein these groups may have a substituent.

2. Method for Producing Liquid Composition

Next, the method for producing a liquid composition of the present embodiment is described.

The present invention relates to a method for producing a liquid composition comprising a phosphorescent material and an organic solvent, the method comprising the steps of:

dissolving all solutes, including a phosphorescent material, in an organic solvent to prepare a mixed liquid, and filtering the mixed liquid obtained in the above step by a filtering device;

wherein the filtering device comprises a housing or holder, a fluororesin membrane filter, and a filter support member;

a material of a portion of the housing and holder, the portion being in contact with the mixed liquid, is a metal alone or a mixture of a metal and at least one member selected from the group consisting of glass, fluororesins, polyethylene not containing a phosphorus antioxidant, and polyethylene not containing an oxidized phosphorus antioxidant; and a material of a portion of the filter support member, the portion being in contact with the mixed liquid, is at least one member selected from the group consisting of metals, glass, fluororesins, polyethylene not containing a phosphorus antioxidant, and polyethylene not containing an oxidized phosphorus antioxidant.

The oxidized phosphorus antioxidant is, for example, a compound represented by the following formula (1):

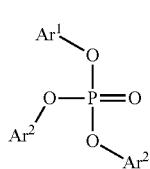

(1)

wherein $Ar^1$ and $Ar^2$ each independently represent an aryl group, such as a phenyl group; and a plurality of $Ar^2$ may be the same or different. Particular examples include a compound represented by the following formula (2):

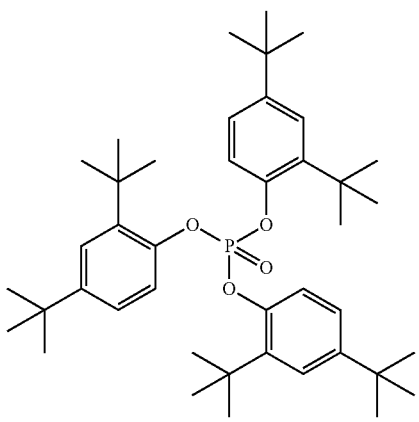

(2)

First, a phosphorescent material is dissolved in an organic solvent to prepare a mixed liquid.

Phosphorescent Material

The phosphorescent material is classified into a low-molecular-weight compound and a polymer compound. The phosphorescent material may have a crosslinkable group.

Examples of low-molecular-weight compounds include triplet light-emitting complexes comprising iridium, platinum, or europium as a central metal.

The polymer compound contains a group obtained by removing one or more hydrogen atoms from the above triplet light-emitting complex. Further, examples include polymer compounds containing a phenylene group, a naphthalenediyl group, an anthracenediyl group, a fluorenediyldiyl group, a phenanthrenediyl group, a dihydrophenanthenediyl group, a group represented by formula (X), a carbazolediyl group, a phenoxazinediyl group, a phenothiazinediyl group, an anthracenediyl group, a pyrenediyl group, and the like.

The detailed description of the phosphorescent material is as described in JP2016-029635A.

Examples of the triplet light-emitting complex include a red phosphorescent complex, a blue phosphorescent complex, and a green phosphorescent complex; preferably a blue phosphorescent complex or a green phosphorescent complex; and more preferably a green phosphorescent complex. The triplet light-emitting complex is preferably an iridium complex.

Preferable examples of the triplet light-emitting complex include metal complexes represented by formulas Ir-1 to Ir-5:

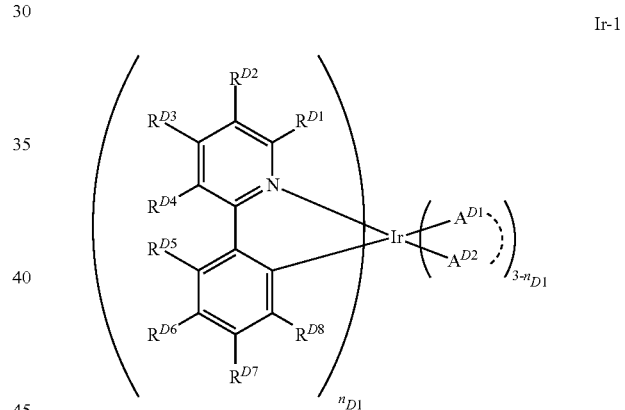

Ir-1

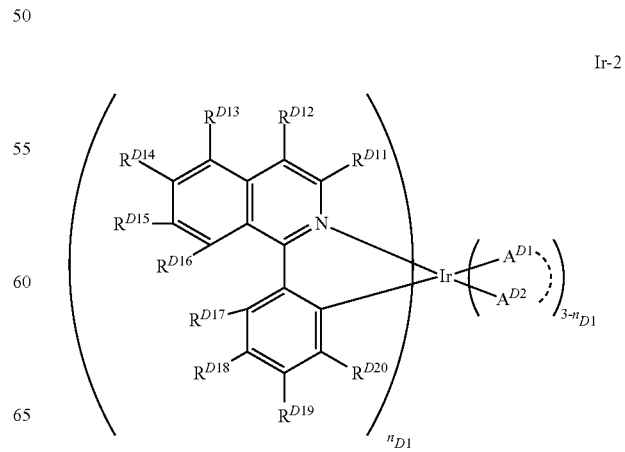

Ir-2

-continued

Ir-3

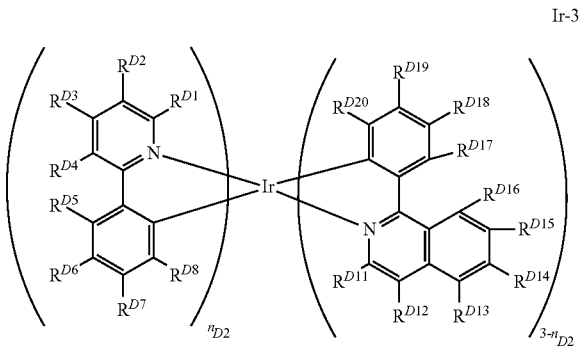

wherein $R^{D1}$ to $R^{D8}$ and $R^{D11}$ to $R^{D20}$ each independently represent a hydrogen atom, an alkyl group, an alkoxy group, an aryl group, an aryloxy group, a monovalent heterocyclic group, or a halogen atom, and these groups may have a substituent; -$A^{D1}$-$A^{D2}$- represents an anionic bidentate ligand, wherein $A^{D1}$ and $A^{D2}$ each independently represent a carbon atom, an oxygen atom, or a nitrogen atom, each of which is bonded to an iridium atom; $n_{D1}$ represents 1, 2, or 3; and $n_{D2}$ represents 1 or 2.

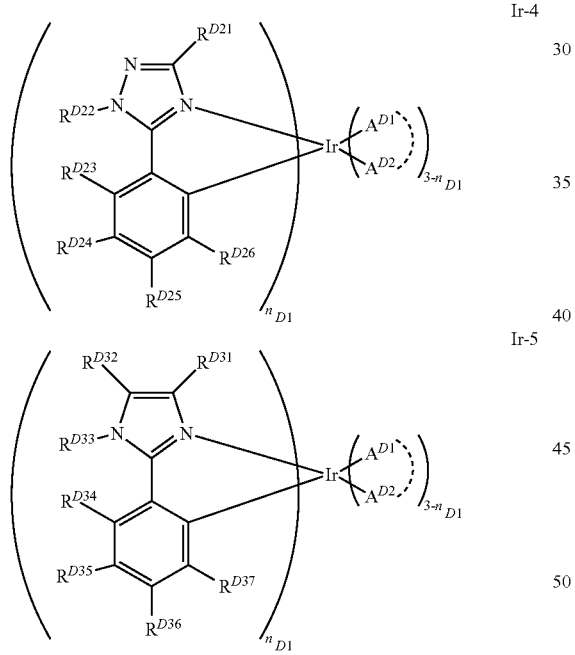

wherein $R^{D21}$ to $R^{D26}$ and $R^{D31}$ to $R^{D37}$ each independently represent a hydrogen atom, an alkyl group, an alkoxy group, an aryl group, an aryloxy group, a monovalent heterocyclic group, or a halogen atom, and these groups may have a substituent; -$A^{D1}$-$A^{D2}$- represents an anionic bidentate ligand, wherein $A^{D1}$ and $A^{D2}$ each independently represent a carbon atom, an oxygen atom, or a nitrogen atom, each of which is bonded to an iridium atom; and $n_{D1}$ represents 1, 2, or 3.

In the triplet light-emitting complex represented by formula Ir-1, at least one of $R^{D1}$ to $R^{D8}$ is preferably a group represented by formula (Dend-A):

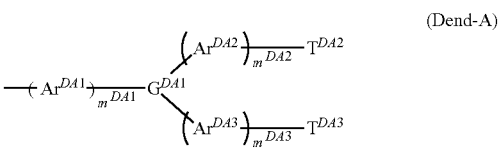

(Dend-A)

wherein $m^{DA1}$, $m^{DA2}$, and $m^{DA3}$ each independently represent an integer of 0 or more; $G^{DA1}$ represents a nitrogen atom, an aromatic hydrocarbon group, or a heterocyclic group, and these groups may have a substituent; $Ar^{DA1}$, $Ar^{DA2}$, and $Ar^{DA3}$ each independently represent an arylene group or a divalent heterocyclic group, and these groups may have a substituent; when there are a plurality of $Ar^{DA1}$, $Ar^{DA2}$, and $Ar^{DA3}$, they may be the same or different; and $T^{DA2}$ and $T^{DA3}$ each independently represent an aryl group or a monovalent heterocyclic group, and these groups may have a substituent.

$m^{DA1}$, $m^{DA2}$, and $m^{DA3}$ are generally 10 or less. $m^{DA1}$, $m^{DA2}$, and $m^{DA3}$ are preferably the same.

$G^{DA1}$ is preferably a group represented by any one of formulas (GDA-11) to (GDA-15), and these groups may have a substituent.

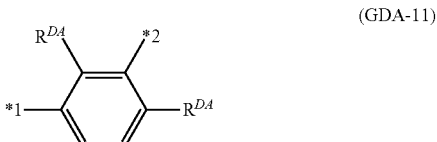

(GDA-11)

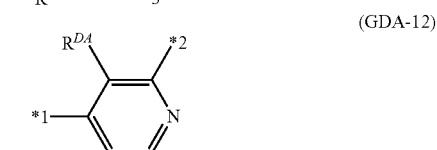

(GDA-12)

(GDA-13)

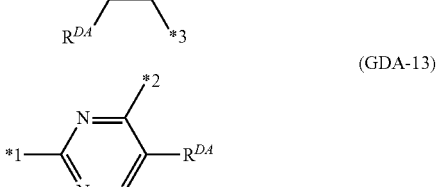

(GDA-14)

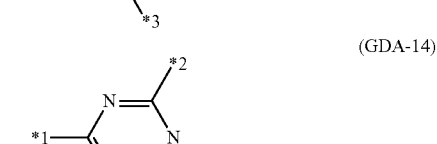

(GDA-15)

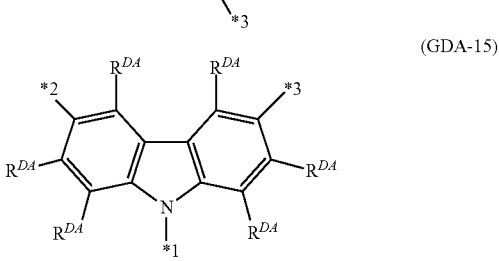

wherein *1, *2, and *3 represent bonds to $Ar^{DA1}$, $Ar^{DA2}$, and $Ar^{DA3}$, respectively; $R^{DA}$ represents a hydrogen atom, an alkyl group, an alkoxy group, an aryl group, or a monovalent heterocyclic group, and these groups may have a substituent; and when there are a plurality of $R^{DA}$, they may be the same or different.

$R^{DA}$ is preferably a hydrogen atom, an alkyl group, or an alkoxy group; and more preferably a hydrogen atom or an alkyl group. These groups may have a substituent.

$Ar^{DA1}$, $Ar^{DA2}$, and $Ar^{DA3}$ are preferably groups represented by formulas (ArDA-1) to (ArDA-3):

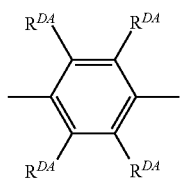

(ArDA-1)

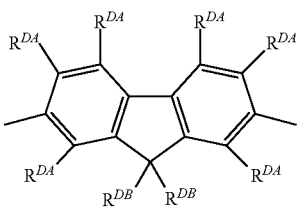

(ArDA-2)

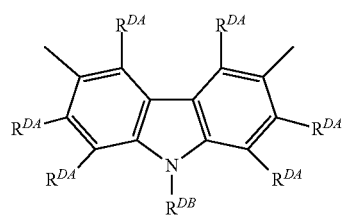

(ArDA-3)

wherein $R^{DA}$ has the same meaning as described above; $R^{DB}$ represents a hydrogen atom, an alkyl group, an aryl group, or a monovalent heterocyclic group, and these groups may have a substituent; and when there are a plurality of $R^{DB}$, they may be the same or different.

$T^{DA2}$ and $T^{DA3}$ are preferably groups represented by formulas (TDA-1) to (TDA-3):

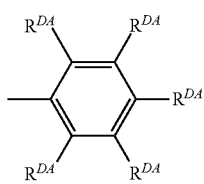

(TDA-1)

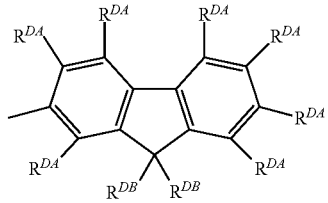

(TDA-2)

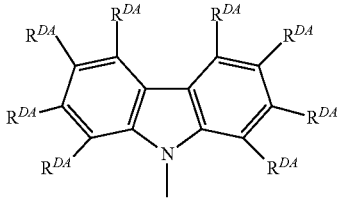

(TDA-3)

wherein $R^{DA}$ and $R^{DB}$ have the same meanings as described above.

In formula Ir-2, at least one of $R^{D11}$ to $R^{D20}$ is preferably a group represented by formula (Dend-A).

In formula Ir-3, at least one of $R^{D1}$ to $R^{D8}$ and $R^{D11}$ to $R^{D20}$ is preferably a group represented by formula (Dend-A).

In formula Ir-4, at least one of $R^{D21}$ to $R^{D26}$ is preferably a group represented by formula (Dend-A).

In formula Ir-5, at least one of $R^{D31}$ to $R^{D37}$ is preferably a group represented by formula (Dend-A).

The group represented by formula (Dend-A) is preferably a group represented by any one of formulas (Dend-A1) to (Dend-A3):

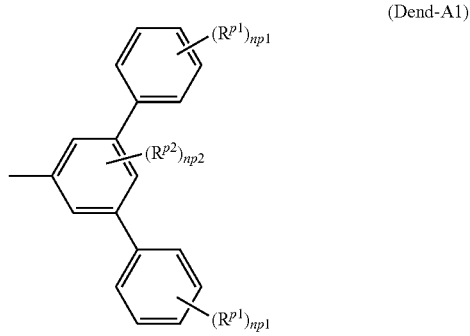

(Dend-A1)

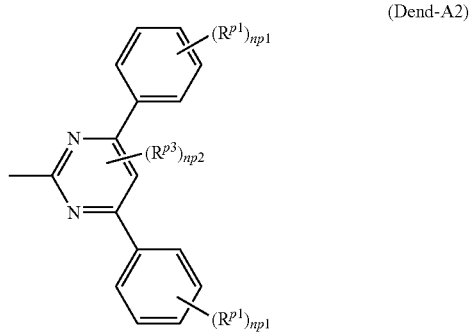

(Dend-A2)

(Dend-A3)

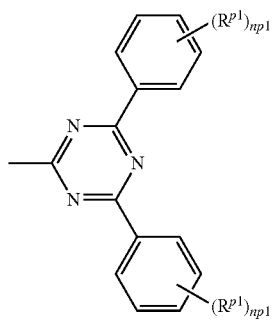

wherein $R^{p1}$, $R^{p2}$, and $R^{p3}$ each independently represent an alkyl group, an alkoxy group, or a halogen atom; when there are a plurality of $R^{p1}$ and $R^{p2}$, they may be the same or different; np1 represents an integer of 0 to 5; np2 represents an integer of 0 to 3; np3 represents 0 or 1; and a plurality of np1 may be the same or different.

np1 is preferably 0 or 1, and more preferably 1. np2 is preferably 0 or 1, and more preferably 0. np3 is preferably 0.

Examples of the anionic bidentate ligand represented by -$A^{D1}$-$A^{D2}$- include ligands represented by the following formulas:

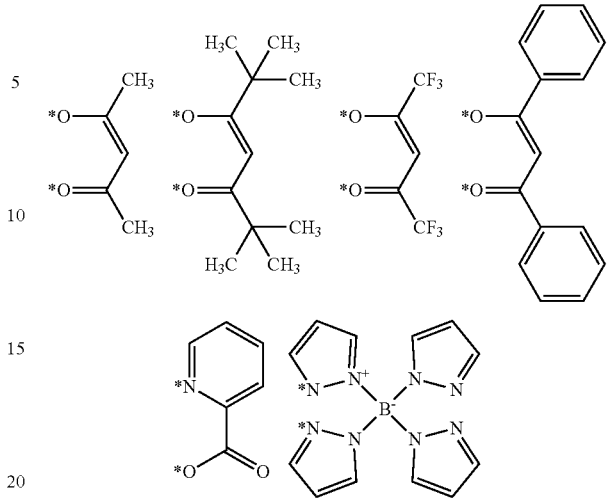

wherein * represents a site binding to Ir.

Examples of the triplet light-emitting complex include metal complexes shown below:

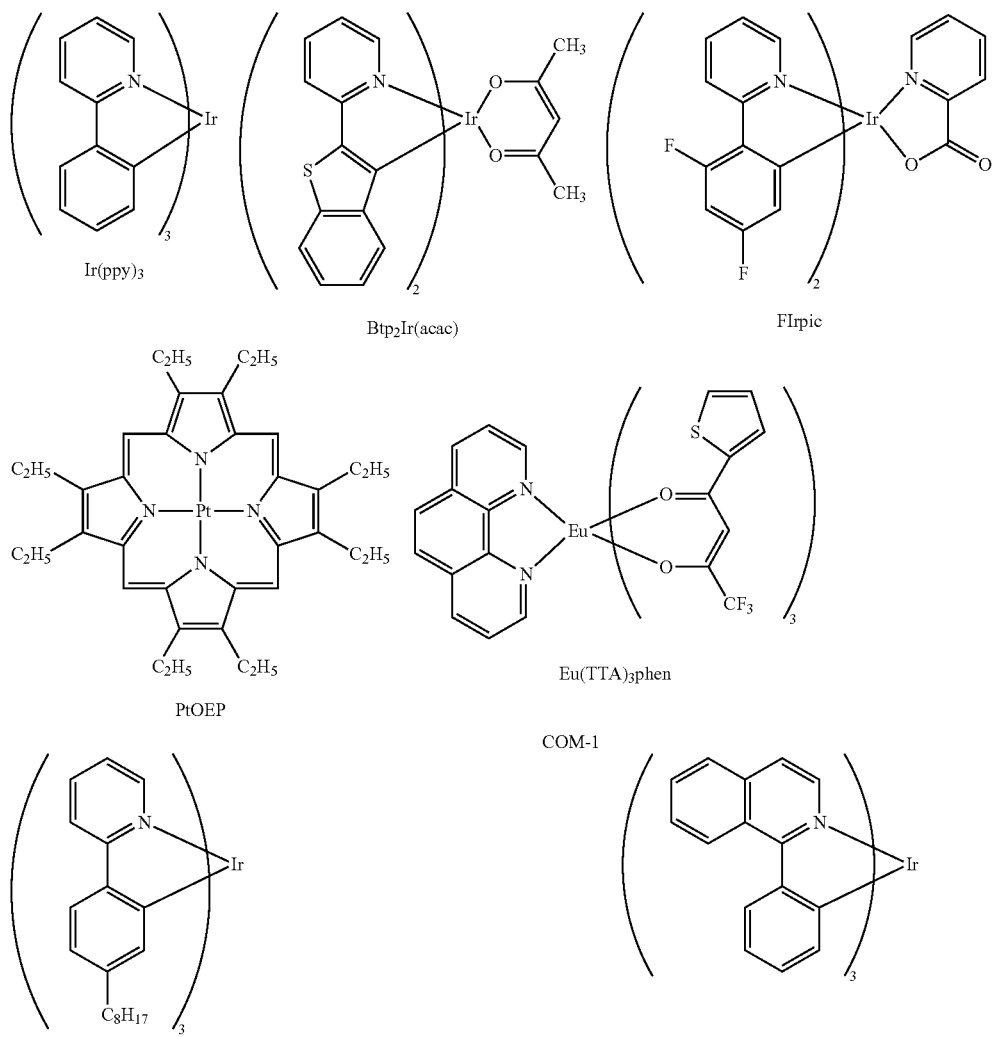

Ir(ppy)₃

Btp₂Ir(acac)

FIrpic

PtOEP

Eu(TTA)₃phen

COM-1

COM-2

-continued
COM-3
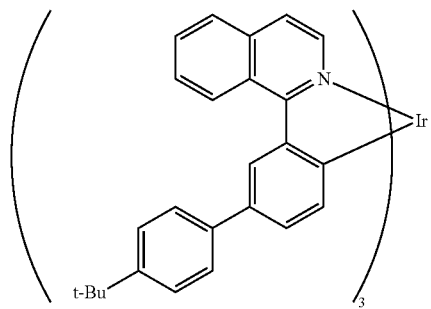
COM-4
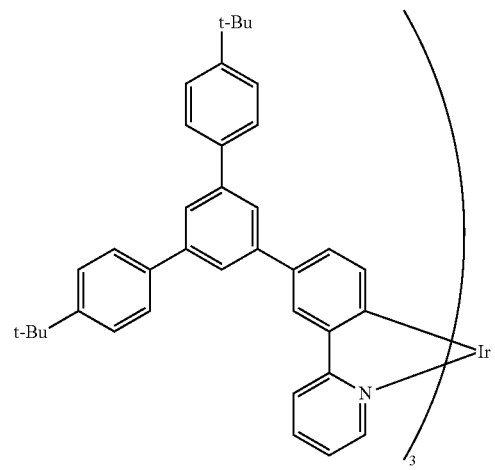
COM-5
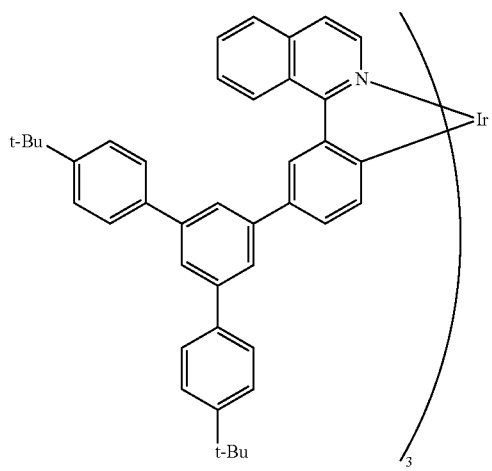
COM-6
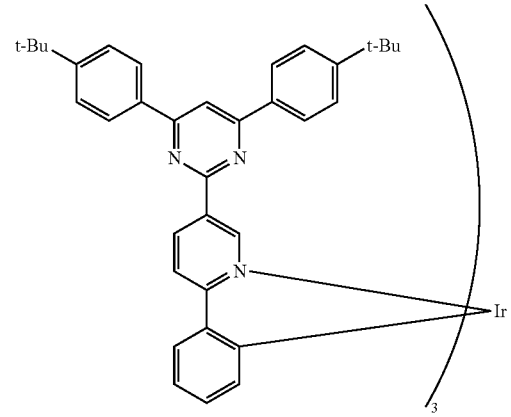
COM-7
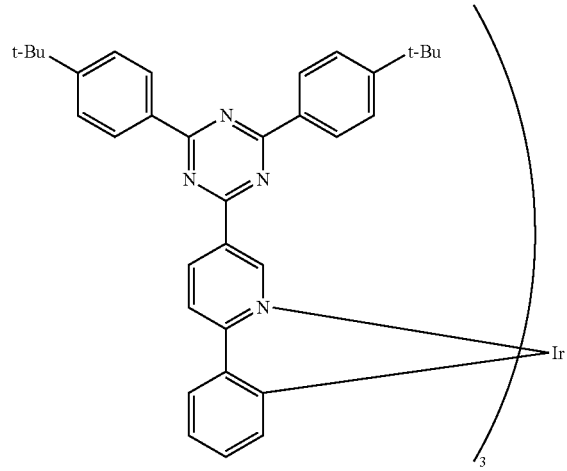

-continued
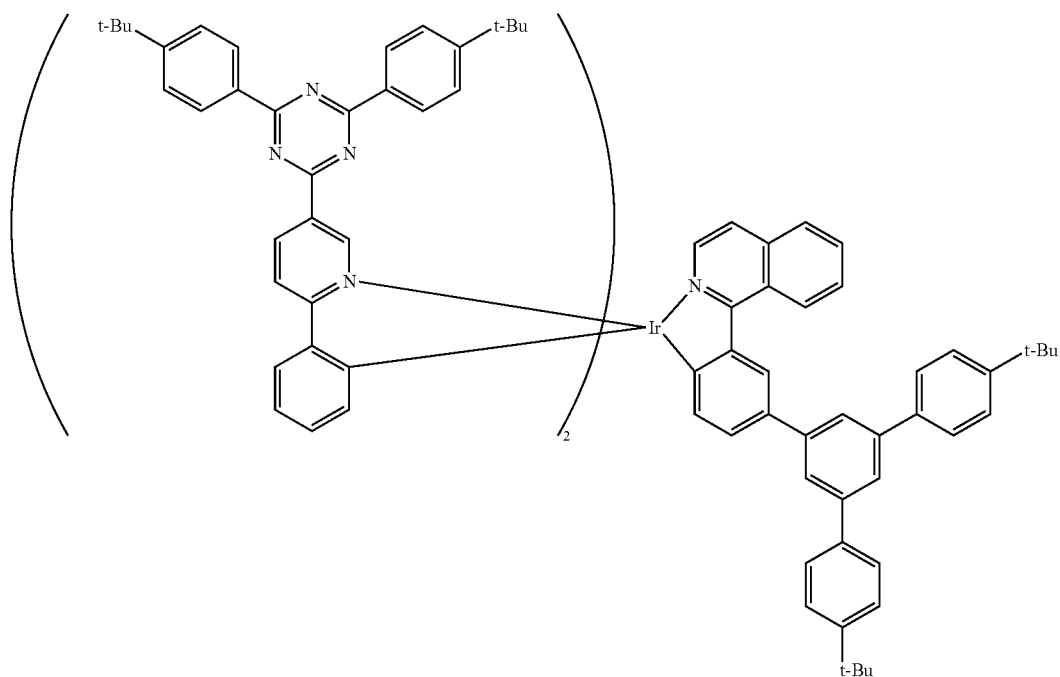
COM-8
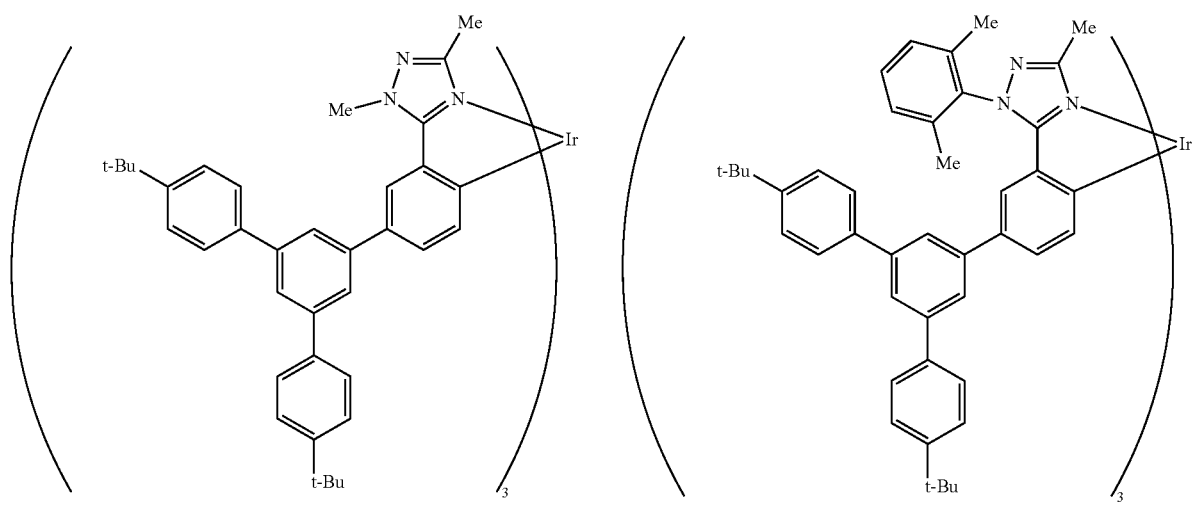
COM-9  COM-10
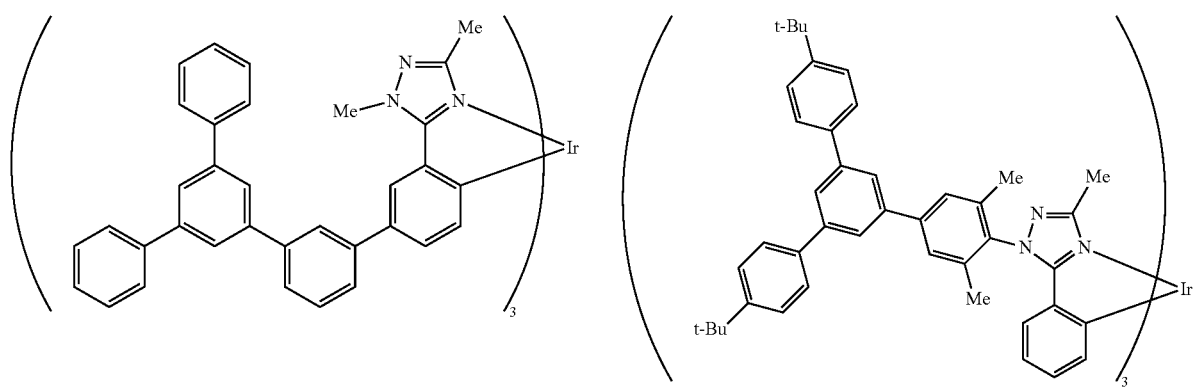
COM-11  COM-12

-continued
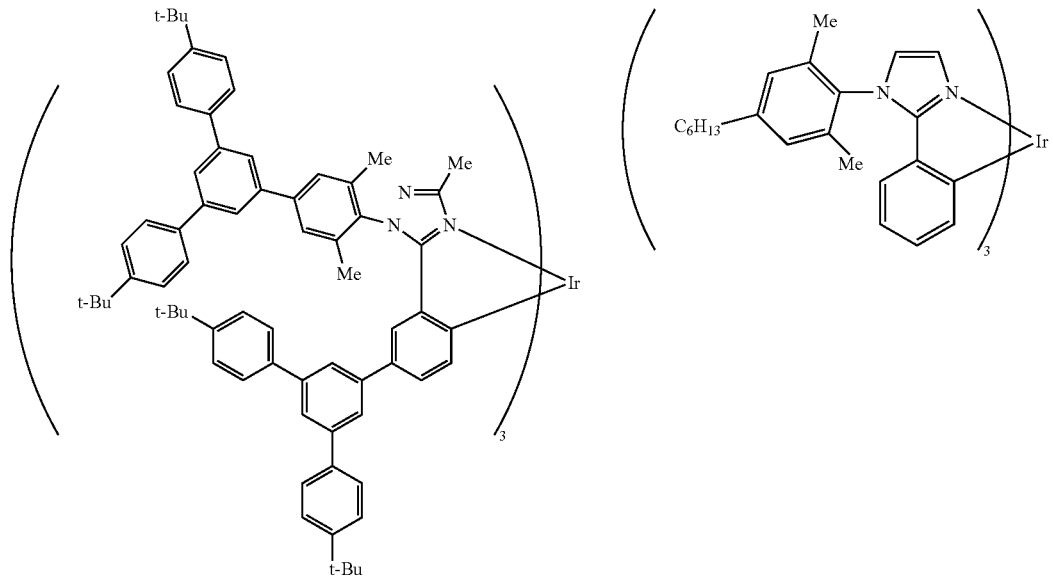
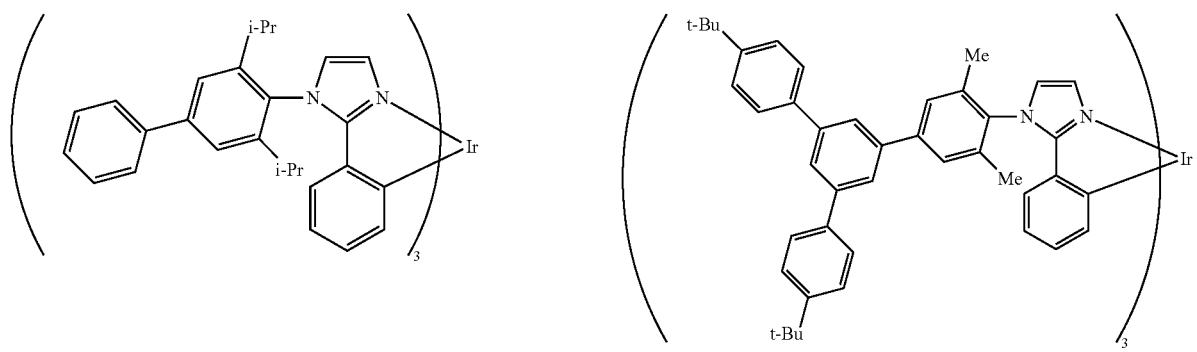
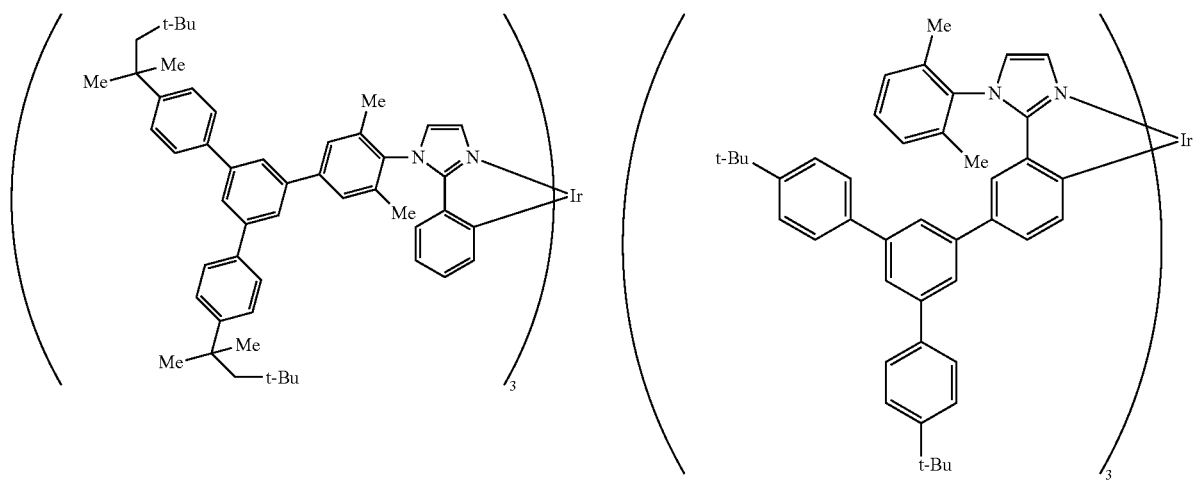

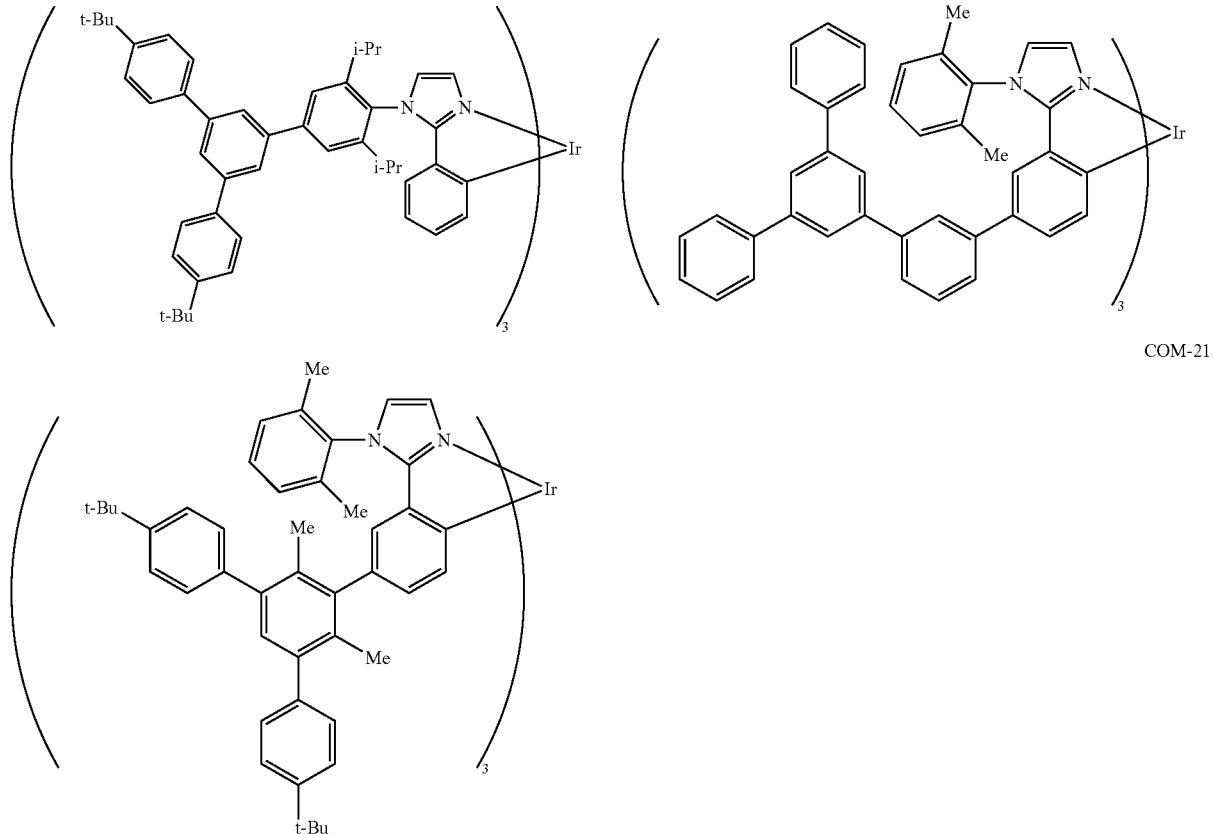

The phosphorescent materials may be used singly or in combination of two or more.

In addition to a phosphorescent material, the mixed liquid can be mixed with a polymer compound and a low-molecular-weight compound as host materials for the phosphorescent material. The mixed liquid may be prepared by dissolving a low-molecular-weight compound and a polymer compound containing a constitutional unit derived from the phosphorescent material in an organic solvent.

As the host materials, known polymer compounds and low-molecular-weight compounds (particularly polymer compounds) that are used as host materials for phosphorescent materials in the art can be widely used. The detailed description of polymer compounds as host materials is as described, for example, in JP2016-029635A, and the detailed description of low-molecular-weight compounds as host materials is as described below. The polymer compound as a host material is preferably a polymer compound having a combination of an arylene group such as a fluorenediyl group or a phenylene group, a divalent heterocyclic group such as a triazinediyl group, an aromatic amine residue, etc.

Low-Molecular-Weight Compound as Host Material

The low-molecular-weight compound as a host material is preferably a compound represented by formula (H-1):

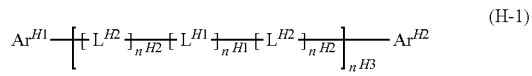

(H-1)

wherein $Ar^{H1}$ and $Ar^{H2}$ each independently represent an aryl group or a monovalent heterocyclic group, and these groups may have a substituent;

$n^{H1}$ and $n^{H2}$ each independently represent 0 or 1; when there are a plurality of $n^{H1}$, they may be the same or different; and a plurality of $n^{H2}$ may be the same or different;

$n^{H3}$ represents an integer of 0 or more and 10 or less;

$L^{H1}$ represents an arylene group, a divalent heterocyclic group, or a group represented by $—[C(R^{H11})_2]n^{H11}-$, and these groups may have a substituent; when there are a plurality of $L^{H1}$, they may be the same or different; $n^{H11}$ represents an integer of 1 or more and 10 or less; $R^{H11}$ represents a hydrogen atom, an alkyl group, an alkoxy group, an aryl group, or a monovalent heterocyclic group, and these groups may have a substituent; and a plurality of $R^{H11}$ may be the same or different, and may be bonded to each other to form a ring together with the carbon atoms to which they are bonded; and $L^{H2}$ represents a group represented by $—N(R^{H21})—$, wherein $R^{H21}$ represents a hydrogen atom, an alkyl group, an aryl group, or a monovalent heterocyclic group, and these groups may have a substituent.

$Ar^{H1}$ and $Ar^{H2}$ are each preferably a phenyl group, a fluorenyl group, a spirobifluorenyl group, a pyridyl group, a pyrimidinyl group, a triazinyl group, a dibenzothienyl group, a dibenzofuryl group, a carbazolyl group, an azacarbazolyl group, an indolocarbazolyl group, an indenocarbazolyl group, or a diazacarbazolyl group; more preferably a phenyl group, a fluorenyl group, a spirobifluorenyl group, a dibenzothienyl group, a dibenzofuryl group, a carbazolyl group, an indolocarbazolyl group, or an indenocarbazolyl group; and even more preferably a phenyl group, a carbazolyl group, an indolocarbazolyl group, or an indenocarbazolyl group. These groups may have a substituent.

The substituents that $Ar^{H1}$ and $Ar^{H2}$ may have are preferably halogen atoms, alkyl groups, alkoxy groups, aryl groups, monovalent heterocyclic groups, or substituted amino groups; more preferably alkyl groups, aryl groups, or monovalent heterocyclic groups; even more preferably alkyl groups or aryl groups; and particularly preferably alkyl groups. These groups may have a substituent.

$n^{H1}$ is preferably 1. $n^{H2}$ is preferably 0.

$n^{H3}$ is generally an integer of 0 or more and 10 or less, preferably an integer of 0 or more and 5 or less, more preferably an integer of 1 or more and 3 or less, and particularly preferably 1.

$n^{H11}$ is preferably an integer of 1 or more and 5 or less, more preferably an integer of 1 or more and 3 or less, and even more preferably 1.

$R^{H11}$ is preferably a hydrogen atom, an alkyl group, an aryl group, or a monovalent heterocyclic group; and more preferably a hydrogen atom or an alkyl group. These groups may have a substituent.

$L^{H1}$ is preferably an arylene group or a divalent heterocyclic group. These groups may further have a substituent.

$L^{H1}$ is preferably a divalent group obtained by removing two hydrogen atoms among hydrogen atoms directly bonded to carbon atoms or heteroatoms constituting the ring of benzene, fluorene, spirobifluorene, phenanthrene, dihydrophenanthrene, pyridine, diazabenzene, triazine, azanaphthalene, diazanaphthalene, carbazole, dibenzofuran, dibenzothiophene, phenoxazine, or phenothiazine; more preferably a divalent group obtained by removing two hydrogen atoms among hydrogen atoms directly bonded to carbon atoms or heteroatoms constituting the ring of benzene, fluorene, spirobifluorene, pyridine, diazabenzene, triazine, carbazole, dibenzofuran, or dibenzothiophene; and particularly preferably a divalent group obtained by removing two hydrogen atoms among hydrogen atoms directly bonded to carbon atoms or heteroatoms constituting the ring of triazine, dibenzofuran, or dibenzothiophene. These groups may have a substituent.

The examples and preferred ranges of the substituents that $L^{H1}$ may have are the same as the examples and preferred ranges of the substituents that $Ar^{H1}$ and $Ar^{H2}$ may have.

$R^{H21}$ is preferably an aryl group or a monovalent heterocyclic group, and these groups may have a substituent.

The definitions and examples of the aryl group and monovalent heterocyclic group represented by $R^{H21}$ are the same as the definitions and examples of the aryl group and monovalent heterocyclic group represented by $Ar^{H1}$ and $Ar^{H2}$.

The definitions and examples of the substituents that $R^{H21}$ may have are the same as the definitions and examples of the substituents that $Ar^{H1}$ and $Ar^{H2}$ may have.

The compound represented by formula (H-1) is preferably a compound represented by formula (H-2):

(H-2)

wherein $Ar^{H1}$, $Ar^{H2}$, $n^{H3}$, and $L^{H1}$ have the same meanings as described above.

Examples of the compound represented by formula (H-1) include compounds represented by the following formulas. In the formulas, Z represents a group represented by —N═ or a group represented by —CH═.

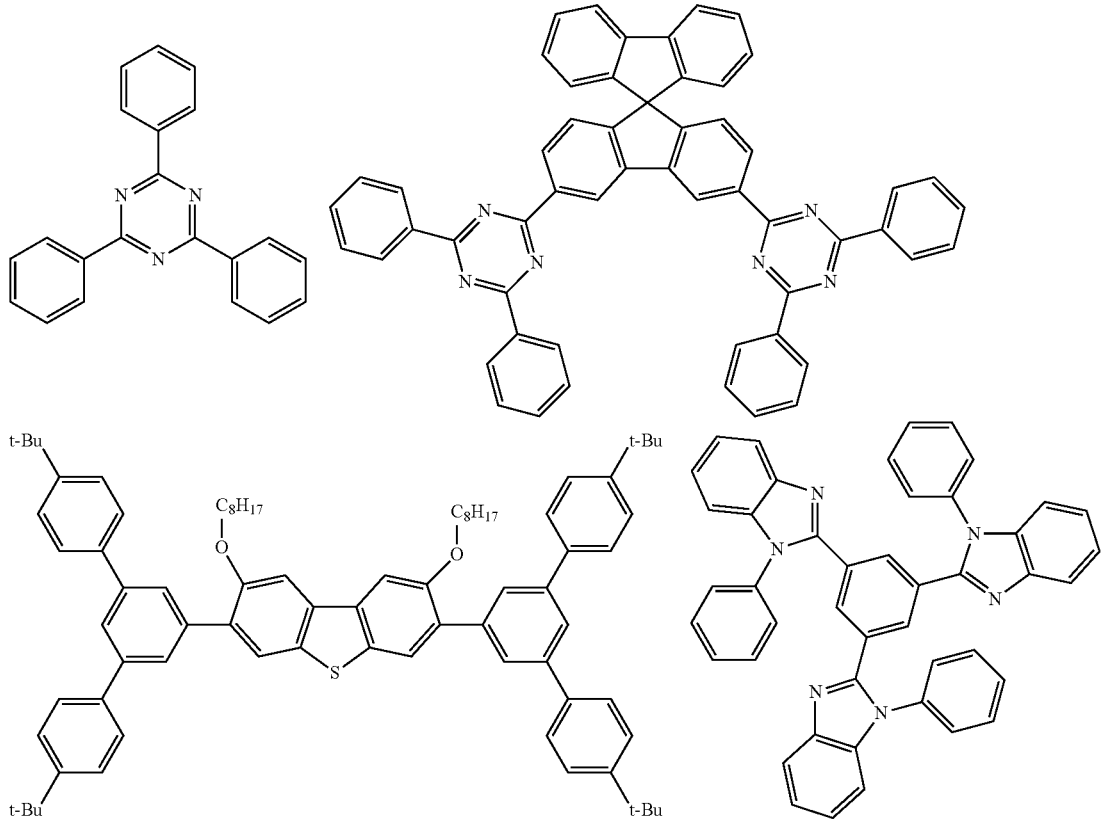

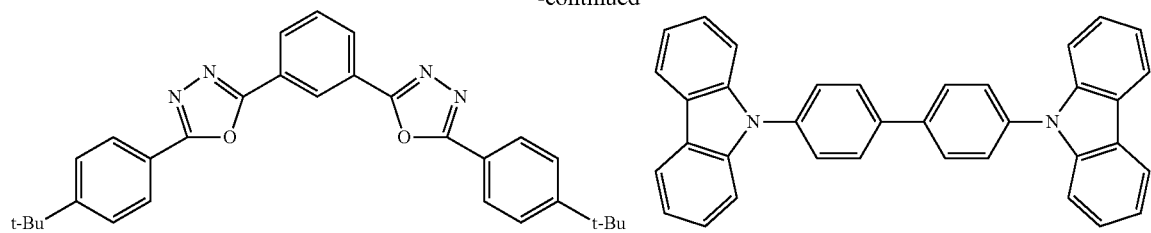
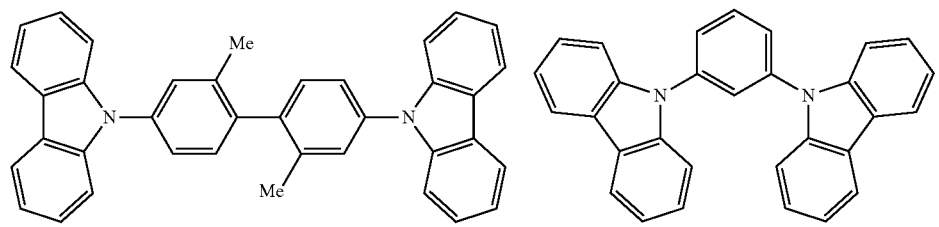
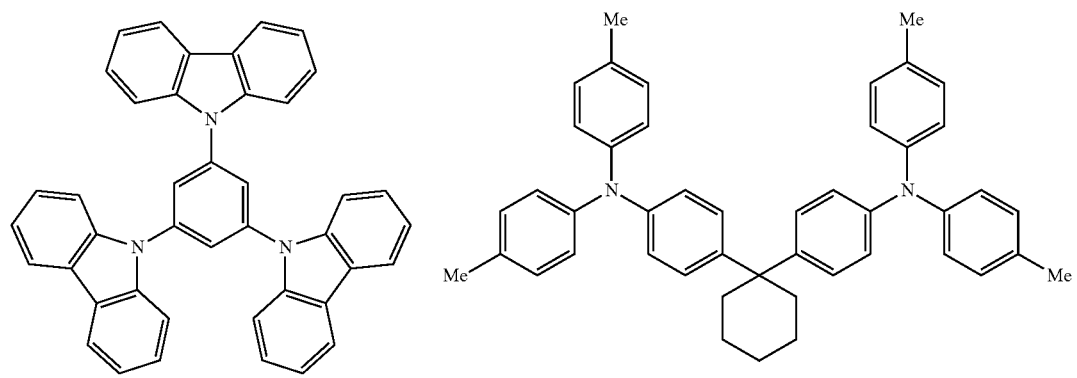
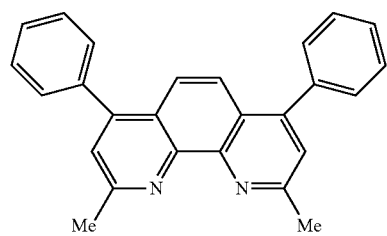
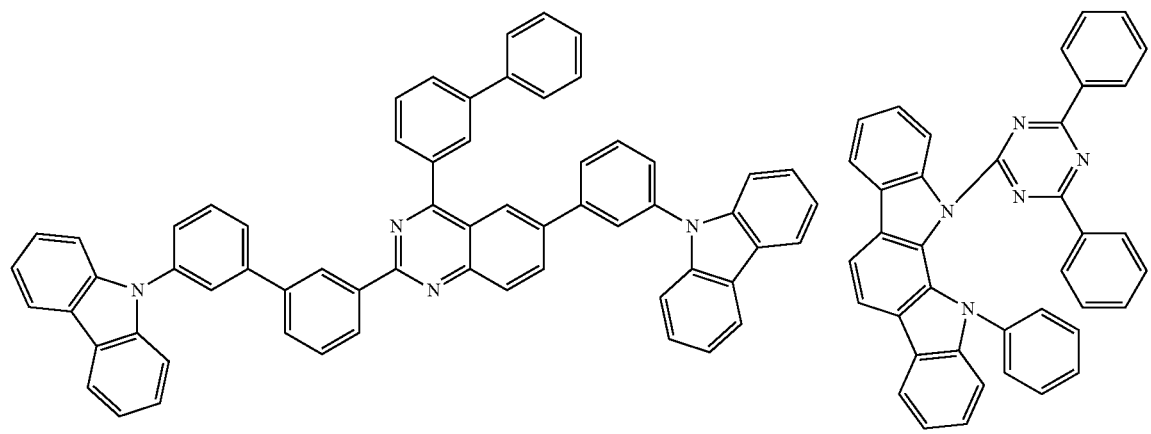

-continued

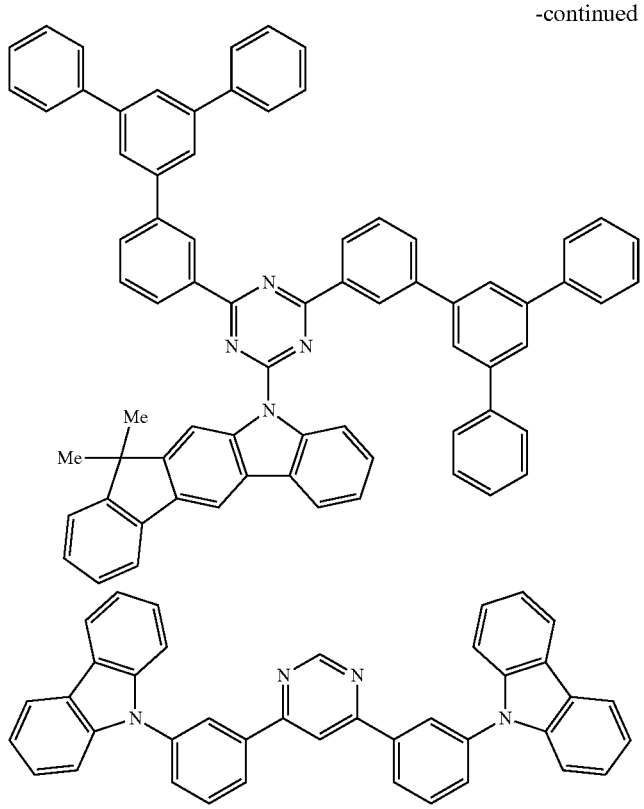

The compounds represented by formula (H-1) are available from Aldrich, Luminescence Technology Corp., and the like. In addition, these compounds can be synthesized according to the methods described, for example, in WO2007/063754, WO2008/056746, WO2011/032686, WO2012/096263, JP2009-227663A, JP2010-275255A, etc.

The host materials may be used singly or in combination of two or more.

In addition to a phosphorescent material and an optionally mixed polymer compound or low-molecular-weight compound, additives generally used in the art can be added to the mixed liquid. Examples of additives include non phosphorus antioxidants. Examples of non phosphorus antioxidants include radical chain inhibitors, peroxide decomposers, and the like. Preferable examples of radical chain inhibitors include the aromatic amine radical chain inhibitors, monophenol radical chain inhibitors, bisphenol radical chain inhibitors, etc., described in JP2015-63662A.

The additives may be used singly or in combination of two or more. When additives are mixed, the mixing amount thereof may be adjusted as appropriate so as not to affect the device characteristics etc.

The organic solvent used in the present invention is preferably a solvent capable of dissolving or uniformly dispersing solids (a phosphorescent material, and optionally a polymer compound, or a polymer compound containing a constitutional unit derived from the phosphorescent material). Examples of such organic solvents include hydrocarbon solvents, monohydric alcohol solvents, polyhydric alcohol solvents, ester solvents, ketone solvents, ether solvents, nitrogen atom-containing solvents, sulfur atom-containing solvents, and the like.

Examples of hydrocarbon solvents include aliphatic hydrocarbon solvents, such as n-octane, n-nonane, n-decane, n-undecane, n-dodecane, n-tridecane, n-tetradecane, 2-methylheptane, 3-methylheptane, 4-methylheptane, 2,2-dimethylhexane, 2,3-dimethylhexane, 2,4-dimethylhexane, 2,5-dimethylhexane, 3,3-dimethylhexane, 3-ethylhexane, 2,2,4-trimethylpentane, 2-methyloctane, 2-methylnonane, 2-methyldecane, 2-methylundecane, 2-methyldodecane, 2-methyltridecane, methylcyclohexane, ethylcyclohexane, 1,1-dimethylcyclohexane, 1,2-dimethylcyclohexane, cycloheptane, methylcycloheptane, bicyclohexyl, and decalin; and aromatic hydrocarbon solvents, such as toluene, ethylbenzene, n-propylbenzene, n-butylbenzene, n-pentylbenzene, n-hexylbenzene, n-heptylbenzene, n-octylbenzel, n-nonylbenzene, n-decylbenzene, n-undecylbenzene, n-dodecylbenzene, isopropylbenzene, isobutylbenzene, sec-butylbenzene, tert-butylbenzene, isopentylbenzene, isohexylbenzene, isooctylbenzene, isononylbenzene, isodecylbenzene, isoundecylbenzene, isododecylbenzene, cyclopentylbenzene, 2-methylcyclopentylbenzene, 3-methylcyclopentylbenzene, cyclohexylbenzene, o-xylene, m-xylene, p-xylene, 1,2,3-trimethylbenzene, 1,2,4-trimethylbenzene, 1,3,5-trimethylbenzene (mesitylene), o-ethylmethylbenzene, m-ethylmethylbenzene, p-ethylmethylbenzene, o-diethylbenzene, m-diethylbenzene, p-diethylbenzene, 1,2-di-n-propylbenzene, 1,3-di-n-propylbenzene, 1,4-di-n-propylbenzene, 1,2-diisopropylbenzene, 1,3-diisopropylbenzene, and 1,4-diisopropylbenzene.

Examples of monohydric alcohol solvents include aliphatic alcohol solvents, such as 1-hexanol, 1-heptanol, 1-octanol, 1-nonanol, 1-decanol, 1-undecanol, 1-dodecanol, 2-hexanol, 2-heptanol, 2-octanol, 2-nonanol, 2-decanol, 2-undecanol, 2-dodecanol, cyclopentanol, cyclohexanol, cyclohexylmethanol, methylcyclohexanol, and dimethylcyclohexanol; and aromatic alcohol solvents, such as benzyl alcohol.

Examples of polyhydric alcohol solvents include dihydric alcohol solvents, such as glycols and glycol monoethers; and trihydric alcohol solvents, such as glycerin. Examples of the glycols include ethylene glycol, propylene glycol, diethylene glycol, triethylene glycol, dipropylene glycol, tripropylene glycol, neopentyl glycol, 1,3-butanediol, 1,4-butanediol, 1,5-pentanediol, 1,6-hexanediol, and the like. Examples of the glycol monoethers include diethylene glycol monomethyl ether, triethylene glycol monomethyl ether, ethylene glycol mono-2-ethylbexyl ether, ethylene glycol monomethyl ether, ethylene glycol monoethyl ether, ethylene glycol monobutyl ether, ethylene glycol monohexyl ether, ethylene glycol monobenzyl ether, propylene glycol monoethyl ether, propylene glycol monomethyl ether, and the like.

Examples of ester solvents include aliphatic ester solvents, such as n-butyl acetate, n-pentyl acetate, n-hexyl acetate, n-octyl acetate, n-propyl propionate, n-butyl propionate, n-pentyl propionate, n-hexyl propionate, methyl lactate, ethyl lactate, methyl pyruvate, ethyl pyruvate, dimethyl oxalate, diethyl oxalate, dimethyl succinate, diethyl succinate, dimethyl malonate, diethyl malonate, phenyl acetate, benzyl acetate, phenyl propionate, and benzyl propionate; aromatic ester solvents, such as methyl benzoate, ethyl benzoate, n-propyl benzoate, isopropyl benzoate, n-butyl benzoate, tert-butyl benzoate, n-pentyl benzoate, n-hexyl benzoate, dimethyl phthalate, and diethyl phthalate.

Examples of ether solvents include aliphatic ether solvents, such as diethylene glycol dimethyl ether, diethylene glycol diethyl ether, triethylene glycol dimethyl ether, tetraethylene glycol dimethyl ether, dibutyl ether, dioxane, and tetrahydrofuran; aromatic-aliphatic ether solvents, such as anisole, ethyl phenyl ether, n-propyl phenyl ether, isopropyl phenyl ether, n-butyl phenyl ether, n-pentyl phenyl ether, n-hexyl phenyl ether, n-heptyl phenyl ether, n-octyl phenyl ether, 2-methylanisole, 3-methylanisole, 4-methylanisole, 2-ethylanisole, 4-ethylanisole, 4-n-propylanisole, 4-isopropylanisole, 4-n-butylanisole, 4-t-butylanisole, n-pentylanisole, n-hexylanisole, n-heptylanisole, n-octylanisole, 2,3-dimethylanisole, 2,4-dimethylanisole, 2,5-dimethylanisole, 3,4-dimethylanisole, 3,5-dimethylanisole, methylethylanisole, diethylanisole, 2-ethyltolylether, 3-ethyltolylether, 4-ethyltolylether, 3-n-propyltolylether, 3-isopropyltolylether, n-butyltolylether, n-pentyltolylether, n-hexyltolylether, n-heptyltolylether, n-octyltolylether, n-propylsilylether, n-butylsilylether, 2,3-dimethoxytoluene, 2,4-dimethoxytoluene, 2,5-dimethoxytoluene, 3,4-dimethoxytoluene, 3,5-dimethoxytoluene, 2-methoxy-3-ethoxytoluene, 2,3-diethoxytoluene, 1,4-dimethoxy-2,5-dimethylbenzene, and 1,4-diethoxy-2,5-dimethylbenzene; and aromatic-aromatic ether solvents, such as diphenyl ether(phenoxybenzene), 2-phenoxytoluene, 3-phenoxytoluene, 4-phenoxytoluene, and 1-phenoxy-3,5-dimethylbenzene.

Examples of ketone solvents include aliphatic ketones, such as 2-pentanone, 3-pentanone, 3-methyl-2-butanone, 2-hexanone, 3-hexanone, 3-methyl-2-pentanone, 4-methyl-2-pentanone, 2-methyl-3-pentanone, 2-heptanone, 3-heptanone, 4-heptanone, diisopropyl ketone, diisobutyl ketone, cyclopentanone, cyclohexanone, methylcyclopentanone, and methylcyclohexanone; aliphatic aromatic ketones, such as acetophenone; and the like.

Examples of nitrogen atom-containing solvents include acetamide, n-methylpyrrolidone, 2-pyrrolidone, N,N-dimethylacetamide, N,N-dimethylformamide, N,N-diisopropylethylamine, and the like.

Examples of sulfur atom-containing solvents include thiodiglycol, sulfolane, dimethyl sulfoxide, and the like.

The organic solvents may be used singly or in combination of two or more.

The range of the boiling point of the organic solvent may be suitably determined in consideration of workability etc., and is generally 100° C. to 330° C., preferably 120° C. to 320° C., and more preferably 160° C. to 300° C. In order to improve the flatness of the layer, organic solvents having different boiling points may be used in combination.

The organic solvent preferably has an appropriate solubility for the phosphorescent material and host materials, and preferably has a solubility of generally 0.01 mass % or more, and particularly 0.1 mass % or more. Regarding the solubility, a single solvent does not necessarily have the above solubility. Even if the solubility of a single solvent is less than 0.01 mass %, the solubility of a mixed solvent with other solvents may be generally 0.01 mass % or more, and preferably 0.1 mass % or more.

Preferable among the above organic solvents are hydrocarbon solvents, such as aromatic hydrocarbon solvents; alcohol solvents, such as polyhydric alcohol solvents; ester solvents, such as aromatic ester solvents; ether solvents, such as aliphatic ether solvents, aromatic-aliphatic ether solvents, and aromatic-aromatic ether solvents; and ketone solvents. More preferable are aromatic hydrocarbon solvents, aromatic ester solvents, aliphatic ether solvents, aromatic-aliphatic ether solvents, and aromatic-aromatic ether solvents.

It is desirable that the organic solvent does not contain impurities.

Examples of impurities include metals, metal ions, halogens, peroxides, phosphorus antioxidants, oxidized phosphorus antioxidants, and the like.

When metals or metal ions are present as impurities in the organic solvent, and remain in the light-emitting device, they may cause short circuits, bright spots, dark spots, and the like. Therefore, the metal or metal ion content of the organic solvent is preferably 10 ppm or less (mass basis).

When impurities, including halogens such as chlorine, bromine, and iodine, are present in the organic solvent, and remain in the device, the device characteristics may be affected. Therefore, the amount of impurities, including halogens, contained in the organic solvent is preferably 100 ppm or less (mass basis).

The presence of peroxides in the organic solvent may degrade the phosphorescent material or host materials, and reduce the current efficiency of the light-emitting device. Therefore, the peroxide content of the organic solvent is preferably 100 ppm or less (mass basis). Moreover, in order to suppress an increase of peroxides during storage of the solvent, the radical chain inhibitors described in JP2015-63662A may be added.

The phosphorus antioxidant and the oxidized phosphorus antioxidant (compound of formula (1)) can remain in the device to thereby reduce the device lifetime, even if they are present in very small amounts. Therefore, the contents of the phosphorus antioxidant and the oxidized phosphorus antioxidant are preferably 1 ppm or less, and more preferably 100 ppb or less, on mass basis, based on the amount of solvent.

It is desirable to purify the organic solvent in order to remove the above impurities. Examples of the purification method generally include distillation, rectification, and adsorption removal of impurities with an adsorbent. These may be combined for purification. It is preferable to use a material that does not elute the above impurities, in the liquid contact portion of the device in the purification operation. Therefore, the liquid contact portion of the device is preferably made of a material selected from metals, glass, fluororesins, and polyethylene not containing a phosphorus antioxidant and polyethylene not containing an oxidized phosphorus antioxidant.

The container for storing the organic solvent has durability against the organic solvent, and the liquid contact portion is preferably made of a material that does not elute the above impurities. Therefore, the container for storing the organic solvent is preferably made of a material selected from metals, glass, fluororesins, polyethylene not containing a phosphatephosphorus antioxidant, and polyethylene not containing an oxidized phosphatephosphorus antioxidant.

Further, it is desirable that the container for storing the organic solvent has sealing properties and light-shielding properties.

The storage conditions for the organic solvent are not particularly limited. The organic solvent is generally stored at −5 to 50° C. while generally avoiding direct sunlight, and preferably stored in a dark place.

The gas phase portion of the organic solvent storage container may be air, but is preferably replaced with an inert gas, such as nitrogen or argon, so that the oxygen concentration in the organic solvent storage container is 10 mass % or less.

The step of dissolving solids, such as a phosphorescent material, in an organic solvent is performed in a glass container (e.g., a glass screw tube, a glass bottle, or a glass flask), a metal container, a fluororesin container, or a glass-lined (GL) container (e.g., a reaction vessel), depending on the amount of liquid composition to be produced. In order to perform dissolution quickly, stirring is preferably performed using a stirring means, such as a magnetic stirrer or a stirring blade. A shaker may be used for shaking.

The dissolution operation can be performed under an air atmosphere. When a large amount of solvent is handled, it is preferable to replace the gas phase portion with an inert gas so that the oxygen concentration is 10 mass % or less, in terms of disaster prevention and safety. The inert gas is preferably nitrogen gas or argon gas, and more preferably nitrogen gas.

The temperature during dissolution is not particularly limited, and is generally from the melting point of the solvent to the boiling point of the solvent, preferably 0 to 60° C., and more preferably 5 to 40° C. The dissolution may be promoted by heating to 30° C. or higher.

The dissolution time is not particularly limited, and is generally 1 minute to 96 hours. It is desirable to confirm dissolution and complete the dissolution operation. The completion of dissolution can be confirmed by visual observation, absorbance analysis, chromatographic analysis, evaporation residue measurement, specific gravity measurement, or viscosity measurement. It is preferable to confirm the completion of dissolution visually or based on the absorbance of UV spectra. Moreover, for the container, reaction vessel, piping, etc., used for dissolution, it is necessary to use materials that do not elute metals, halogens, phosphorus antioxidants, and oxidized phosphorus antioxidants into the mixed liquid. At least one member selected from the group consisting of metals, glass, fluororesins, polyethylene not containing a phosphorus antioxidant, and polyethylene not containing an oxidized phosphorus antioxidant is used. Preferred materials include stainless steel, borosilicate glass, fully fluorinated resins such as polytetrafluoroethylene (PTEF), partially fluorinated resins such as polychlorotrifluoroethylene (CTFE), polyvinylidene fluoride (PVDF), and polyvinyl fluoride (PVF); fluorinated resin copolymers such as perfluoroalkoxy fluororesin (PFA), tetrafluoroethylene/hexafluoropropylene copolymer (FEP), ethylene/tetrafluoroethylene copolymer (ETFE), and ethylene/chlorotrifluoroethylene copolymer (ECTFE); fluororubber such as vinylidene fluoride-based fluororubber (FKM), tetrafluoroethylene-propylene-based fluororubber (FEPM), and tetrafluoroethylene-perfluorovinyl ether-based fluororubber (FFKM); polyethylene not containing a phosphorus antioxidant and an oxidized form thereof. More preferred materials are stainless steel, borosilicate glass, polytetrafluoroethylene (PTEF), perfluoroalkoxy fluororesin (PFA), tetrafluoroethylene/hexafluoropropylene copolymer (FEP), ethylene/tetrafluoroethylene copolymer (ETFE), tetrafluoroethylene-propylene-based fluororubber (FEPM), and tetrafluoroethylene-perfluorovinyl ether-based fluororubber (FFKM).

The content of the phosphorescent material in the mixed liquid is preferably in the range of 0.01 mass % to 10 mass %, and more preferably in the range of 0.1 mass % to 4 mass %. When the mixed liquid also contains a host material, the content thereof is preferably in the range of 0.01 mass % to 10 mass %, and more preferably in the range of 0.1 mass % to 4 mass %.

Next, the mixed liquid produced in the previous step is filtered by a filtering device. FIG. 1 shows a schematic diagram showing an example of the filtering device used in the present invention. The filtering device 1 comprises a housing 2, a fluororesin membrane filter 3, and a filter support member 4. Alternatively, a filtering device comprising a holder, a fluororesin membrane filter, and a filter support member can be used.

The material of a portion of the housing and holder, the portion being in contact with the mixed liquid, is a metal alone or a mixture of a metal and at least one member selected from the group consisting of glass, fluororesins, polyethylene not containing a phosphorus antioxidant, and polyethylene not containing an oxidized phosphorus antioxidant. Further, the material of a portion of the filter support member, the portion being in contact with the mixed liquid, is at least one member selected from the group consisting of metals, glass, fluororesins, polyethylene not containing a phosphorus antioxidant, and polyethylene not containing an oxidized phosphorus antioxidant. Thus, the filtering device used in the present invention is characterized in that a phosphorus antioxidant and an oxidized form thereof do not elute from the members constituting the filtering device.

It is only necessary that the material of a portion of the housing and holder, the portion being in contact with the mixed liquid, contains a metal alone, or a metal and at least one member selected from the group consisting of glass, fluororesins, polyethylene not containing a phosphorus antioxidant, and polyethylene not containing an oxidized phosphorus antioxidant; however, it is preferable that the entire housing and the entire holder are made of the materials mentioned above. As the metals, glass, fluororesins, polyethylene not containing a phosphorus antioxidant, and polyethylene not containing an oxidized phosphorus antioxidant, the same materials as those mentioned above for the container, reaction vessel, piping, etc., used for dissolution can be used. In terms of conductivity, the housing and holder preferably contain a metal in an amount of 40 mass % or more, and more preferably 50 to 100 mass %, based on the total mass of the housing or holder. The materials of the housing and holder at portions in contact with the mixed liquid are preferably stainless steel and fluororesin.

It is only necessary that the material of the filter support member in a portion in contact with the mixed liquid is at least one member selected from the group consisting of metals, glass, fluororesins, polyethylene not containing a phosphorus antioxidant, and polyethylene not containing an oxidized phosphorus antioxidant; however, it is preferable that the entire filter support member is made of the material mentioned above. As the metals, glass, fluororesins, polyethylene not containing a phosphorus antioxidant, and polyethylene not containing an oxidized phosphorus antioxidant, the same materials as those mentioned above for the container, reaction vessel, piping, etc., used for dissolution can be used.

The filtration method is not limited to a specific method, and can be selected from pressure filtration, vacuum filtration, centrifugal filtration, and natural filtration. In terms of productivity in the production of the liquid composition, pressure filtration or vacuum filtration is preferable, and pressure filtration is more preferable.

In the case of pressure filtration, the method for applying pressure can be a liquid feeding method using gas pressure or a pressurization method using a pump. The gas used is not particularly limited, as long as it is inert to the liquid composition. As the gas, air, nitrogen gas, argon gas, or a mixed gas thereof is generally used, and nitrogen gas or argon gas is preferable. The pressure during pressurization is preferably 1 kPa or more. As long as the filter can withstand the pressure, there is no particular upper limit of the pressure; however, when pressure is applied by gas or using a pump, filtration is performed at a maximum pressure of 5 MPa, preferably 100 kPa or less. The material of the member in contact with the liquid is preferably composed of a pressure-resistant fluororesin, rubber coated with a fluororesin, a metal, or the like.

The temperature during filtration is not particularly limited, as long as the solvent of the mixed liquid is not solidified or boiled. In terms of workability, it is preferable to perform filtration at 5° C. to 60° C., and more preferably at 10° C. to 40° C. In order to keep the temperature constant, the piping, holder, housing, etc., may be heated or cooled from the outside.

For example, a filter having a pore diameter in the range of 0.01 μm to 10 μm can be used. In order to sufficiently remove solids in the mixed liquid, the pore diameter is preferably in the range of 0.02 μm to 1 μm, and more preferably in the range of 0.03 μm to 0.5 μm.

The filtration area of the filter is preferably set to be in the range of, for example, 0.0001 $m^2$/L to 1 $m^2$/L, and preferably 0.001 $m^2$/L to 0.1 $m^2$/L, depending on the flow rate of the mixed liquid to be filtered.

Of the members constituting the filtering device, the filter is preferably a fluororesin membrane, in order to remove solids and prevent elution into the filtered liquid composition. Among fluororesins, polytetrafluoroethylene (PTFE), hydrophilic PTFE, and polyvinylidene fluoride are preferable; and PTFE and polyvinylidene fluoride are more preferable.

The material of the support member that reinforces or holds the filter is selected from those that do not cause elution into the filtered liquid composition. When the type of filtering device is a housing, it is preferable to use a metal, a fluororesin, or rubber coated with a fluororesin as a material for gaskets, washers, etc. Stainless steel is more preferable as the metal. More preferable examples of fluororesins include fully fluorinated resins, such as PTEF; partially fluorinated resins, such as CTFE, PVDF, and PVF; fluorinated resin copolymers, such as PFA, FEP, ETFE, and ECTFE; and fluororubber, such as FKM, FEPM, and FFKM. When the type of filtering device is a disk, it is preferable to use a metal or a fluororesin as a material for filter folders etc. Stainless steel is more preferable as the metal. More preferable examples of fluororesins include fully fluorinated resins, such as PTEF; partially fluorinated resins, such as CTFE, PVDF, and PVF; fluorinated resin copolymers, such as PFA, FEP, ETFE, and ECTFE; and fluororubber, such as FKM, FEPM, and FFKM.

The filtering device preferably has packing, in order to prevent liquid leakage in the filtering device. When the filtering device has packing, the packing material is, for example, a material that does not cause elution of a phosphorus antioxidant and an oxidized form thereof. As such a member, it is preferable to use O-rings made of fluororubber or a fluororesin, such as PTFE or PFA; O-rings made of rubber coated with such fluororesins; or the like.

When the mixed liquid is filtered using a filtering device, a metal is used as the material for the housing and holder. Stainless steel is preferably used because it has strength and corrosion resistance. Since the housing and holder of the filtering device are made of a metal, it is preferable to ground the housing and holder. Grounding makes it possible to further prevent flow electrification, and to produce a liquid composition more safely with high productivity.

As the filtering device, for example, the following product can be used:

a filtering device comprising a combination of a stainless syringe holder produced by Advantec Co., Ltd. (KS-13, KS-25, or KS-25RA) or a PTFE holder produced by Advantec Co., Ltd. (KSP-47-TF, KSP-90-TF, KSP-142-TF, or KSP-293-TF), which are members comprising both a housing and a filter support member, and a PTFE-type membrane filter produced by Advantec Co., Ltd. (T010A-, T020A-, T050A-, or T080A-series) as a fluororesin membrane filter; or a filtering device comprising a combination of, as a housing, a single stainless steel housing produced by Advantec Co., Ltd. (1TS, 1TS-2, 1TS-B, 1TS-2B, 1TM-1S-MV, or 1TM-2S-MV) or a stainless steel housing produced by Pall Corporation (A01 series), and, as a member comprising both a fluororesin membrane filter and a filter support member, a cartridge filter produced by Advantec Co., Ltd. (all-fluororesin cartridge filter: TCF type) or a cartridge filter produced by Pall Corporation (UltiKleen series).

By filtering the mixed liquid using a filtering device to remove solids contained in the mixed liquid, uneven coating or nozzle clogging can be prevented when the liquid composition is applied to form a light-emitting layer. In order to increase the removal efficiency of solids in the mixed liquid, the filtrate once filtered may be further filtered through a new filtering device, or the filtrate that has passed through a filtering device may be returned to the same filtering device again and repeatedly filtered.

Whether solids are removed from the liquid composition after filtration can be confirmed by measuring the number of particles by light scattering.

The filtered liquid composition is placed in a container for storage. The material of the container is preferably one that prevents elution of a phosphorus antioxidant and an oxidized form thereof into the liquid composition. As such a container, a resin bottle whose inner wall is coated with a fluorine-based resin, a glass container, or the like can be used. The liquid composition may be placed in the container directly from the filtering device, or may be first transferred from the filtering device to another container and then transferred to the container.

The liquid composition obtained by the above production method can be applied to a pixel electrode by a conventionally known method. Examples of the coating method include a spin coating method, a casting method, a micro-gravure coating method, a gravure coating method, a bar coating method, a roll coating method, a wire bar coating method, a dip coating method, a spray coating method, a screen printing method, a flexographic printing method, an offset printing method, an inkjet method, a nozzle printing method, and the like. Printing methods, such as a screen printing method, a flexographic printing method, an offset printing method, an inkjet method, and a nozzle printing method, are preferable, because pattern formation and multi-color painting are easy.

The viscosity of the liquid composition may be suitably determined, in consideration of the coating method. When the liquid composition is applied to a printing method in which the liquid composition passes through a discharge device, such as an inkjet method, the viscosity is preferably in the range of 1 to 20 mPa·s at 25° C., in order to prevent clogging or flight bending after discharge.

The liquid composition obtained by the production method of the present invention is suitable for production of organic electroluminescence devices (hereinafter also referred to as "light-emitting devices") using a printing method, such as an inkjet method or a nozzle printing method.

Light-Emitting Device

The light-emitting device has electrodes comprising an anode and a cathode, and a light-emitting layer provided between the electrodes. The light-emitting layer is preferably formed by applying a liquid composition obtained by the production method of the present invention.

Layer Structure

The light-emitting device may further have at least one layer selected from the group consisting of a hole transport layer, a hole injection layer, an electron transport layer, and an electron injection layer. These layers contain, respectively, a hole transport material, a hole injection material, an electron transport material, and an electron injection material, described later.

The light-emitting device preferably has at least one of a hole injection layer and a hole transport layer between the anode and the light-emitting layer, in terms of hole injection properties and hole transport properties. In terms of electron injection properties and electron transport properties, the light-emitting device preferably has at least one of an electron injection layer and an electron transport layer between the cathode and the light-emitting layer.

As the method for forming a hole transport layer, an electron transport layer, a hole injection layer, and an electron injection layer in the light-emitting device, when a low-molecular-weight compound is used, vacuum deposition from powder, and film formation from a solution or a molten state can be used; and when a polymer compound is used, film formation from a solution or a molten state can be used.

The order, number, and thickness of layers to be laminated may be controlled, in consideration of light emission efficiency and device lifetime.

Hole Transport Material

The hole transport material is classified into a low-molecular-weight compound and a polymer compound, preferably a polymer compound, and more preferably a polymer compound having a crosslinkable group.

Examples of polymer compounds include polyvinyl carbazole and derivatives thereof; and polyarylene having an aromatic amine structure in the side chain or main chain, and derivatives thereof. The polymer compound may be a compound to which an electron acceptor site is bonded. Examples of the electron acceptor site include fullerene, tetrafluorotetracyanoquinodimethane, tetracyanoethylene, trinitrofluorenone, and the like; and preferably fullerene.

The hole transport materials may be used singly or in combination of two or more.

Electron Transport Material

The electron transport material is classified into a low-molecular-weight compound and a polymer compound. The electron transport material may have a crosslinkable group.

Examples of low-molecular-weight compounds include metal complexes having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene, diphenoquinone, and derivatives thereof.

Examples of polymer compounds include polyphenylene, polyfluorene, and derivatives thereof. The polymer compound may be doped with a metal.

The electron transport materials may be used singly or in combination of two or more.

Hole Injection Material and Electron Injection Material

The hole injection material and the electron injection material are each classified into a low-molecular-weight compound and a polymer compound. The hole injection material and the electron injection material may have a crosslinkable group.

Examples of low-molecular-weight compounds include metal phthalocyanines, such as copper phthalocyanine; carbon; oxides of metals, such as molybdenum and tungsten; metal fluorides, such as lithium fluoride, sodium fluoride, cesium fluoride, and potassium fluoride.

Examples of polymer compounds include polyaniline, polythiophene, polypyrrole, polyphenylene vinylene, polythienylene vinylene, polyquinoline, polyquinoxaline, and derivatives thereof; and conductive polymers, such as polymers containing an aromatic amine structure in the main chain or side chain.

The hole injection materials and the electron injection materials each may be used singly or in combination of two or more.

Ion Doping

When the hole injection material or the electron injection material contains a conductive polymer, the electrical conductivity of the conductive polymer is preferably $1 \times 10^{-5}$ S/cm to $1 \times 10^3$ S/cm. In order to set the electrical conductivity of the conductive polymer within this range, the conductive polymer can be doped with an appropriate amount of ions.

The type of ion to be doped is an anion for the hole injection material, and a cation for the electron injection material. Examples of anions include polystyrene sulfonate ion, alkylbenzene sulfonate ion, camphor sulfonate ion, and the like. Examples of cations include lithium ion, sodium ion, potassium ion, tetrabutylammonium ion, and the like.

The ions may be doped singly or in combination of two or more.

Substrate or Electrode

The substrate in the light-emitting device may be any substrate that can form an electrode and does not chemically change when an organic layer is formed. Examples of such substrates include substrates made of materials such as glass, plastic, or silicon. In the case of an opaque substrate, the electrode farthest from the substrate is preferably transparent or translucent.

Examples of anode materials include conductive metal oxides, translucent metals, and the like; preferably conductive compounds, such as indium oxide, zinc oxide, tin oxide, indium tin oxide (ITO), and indium zinc oxide; complexes of silver, palladium, and copper (APC); NESA, gold, platinum, silver, copper, and the like.

Examples of cathode materials include metals, such as lithium, sodium, potassium, rubidium, cesium, beryllium, magnesium, calcium, strontium, barium, aluminum, zinc, and indium; alloys of two or more of these metals; alloys of one or more of these metals and one or more of silver, copper, manganese, titanium, cobalt, nickel, tungsten, and tin; and graphite and graphite intercalation compounds. Examples of alloys include magnesium-silver alloy, magnesium-indium alloy, magnesium-aluminum alloy, indium-silver alloy, lithium-aluminum alloy, lithium-magnesium alloy, lithium-indium alloy, calcium-aluminum alloy, and the like.

Each of the anode and cathode may have a laminated structure of two or more layers.

EXAMPLES

The present invention is described in more detail below with reference to Examples. However, the present invention is not limited to these Examples.

Synthesis Example 1

Synthesis of Light-Emitting Material A

Light-emitting material A, which is represented by the following formula, was synthesized in accordance with Synthesis Example 5 disclosed in WO2009/131255.

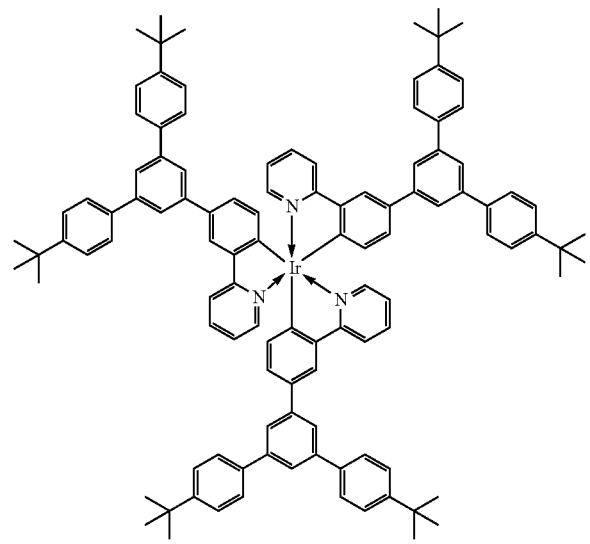

Synthesis Example 2

Synthesis of Polymer Compound B

Polymer compound B was synthesized in accordance with Example 2 disclosed in JP2012-036388A. It is estimated from the ratio of monomers used that polymer compound B comprises the following repeating units in the following molar ratio (PA1)

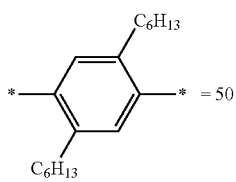

(PB1)

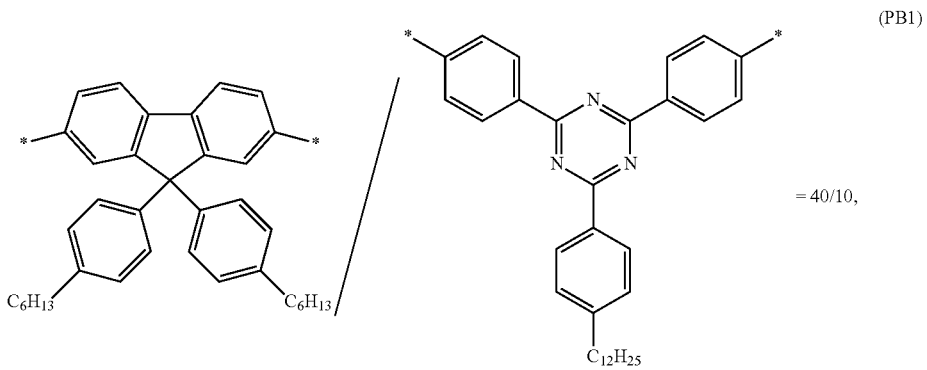

and is configured such that the repeating unit represented by formula (PA1) and the repeating unit represented by formula (PB1) are alternately polymerized. The weight average molecular weight (Mw) and the number average molecular weight (Mn) of polymer compound B were measured by GPC analysis using polystyrene as a reference material. Polymer compound B had Mw of $2.3 \times 10^5$ and Mn of $1.0 \times 10^5$.

Synthesis Example 3

Synthesis of Polymer Compound C

Polymer compound C was synthesized in accordance with Synthesis Example 3 disclosed in JP2013-047315A (Synthesis of Polymer Compound 3). It is estimated from the ratio of monomers used that polymer compound C comprises the following repeating units in the following molar ratio

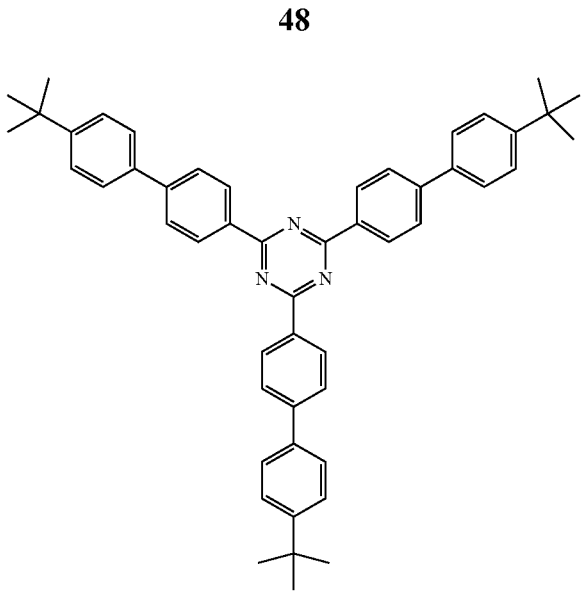

(PA2)

(PB2)

and is configured such that the repeating unit represented by formula (PA2) and the repeating unit represented formula (PB2) are alternately polymerized. The Mw and Mn of polymer compound C were measured in the same manner as in Synthesis Example 2. Polymer compound C had Mw of $3.3 \times 10^5$ and Mn of $6.2 \times 10^4$.

Synthesis Example 4

Synthesis of Low-Molecular-Weight Compound D

Low-molecular-weight compound D, which is represented by the following formula, was synthesized in accordance with the method disclosed in Synthesis Example 10 of JP2010-189630A (Synthesis of Electron Transport Material ET-A).

Low-Molecular-Weight Compound E

Low-molecular-weight compound E, which is represented by the following formula, was purchased from Luminescence Technology, Corp.

Synthesis Example 5

Synthesis of Low-Molecular-Weight Compound F

Low-molecular-weight compound F, which is represented by the following formula, was synthesized in accordance with the method disclosed in Example 37 of WO2010/136109A.

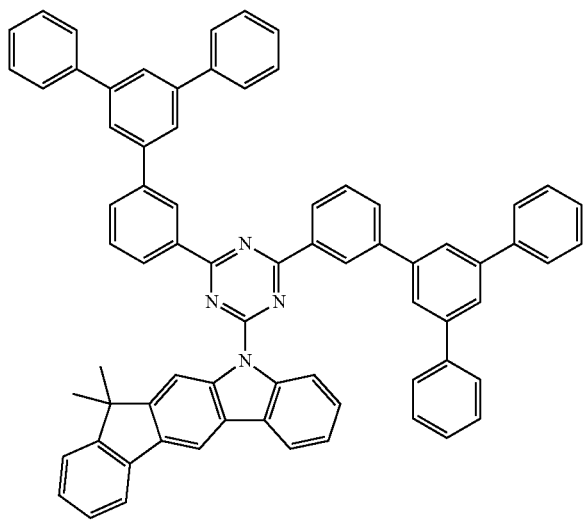 [SMILES: CC1(C)c2ccccc2-c2cc3c4ccccc4n(-c4nc(-c5cccc(-c6cc(-c7ccccc7)cc(-c7ccccc7)c6)c5)nc(-c5cccc(-c6cc(-c7ccccc7)cc(-c7ccccc7)c6)c5)n4)c3cc21]

Example 1

Preparation of Liquid Composition 4.2 parts by mass of light-emitting material A, 4.2 parts by mass of polymer compound B, 784 parts by mass of cyclohexylbenzene containing 2,6-di-tert-butyl-4-methylphenol in a concentration of 100 ppm (on a mass basis), and 202 parts by mass of 4-methylanisole containing 2,6-di-t-butyl-4-methylphenol in a concentration of 100 ppm were mixed and dissolved to prepare a liquid composition a.

Using a filtering device comprising a stainless steel syringe holder KS-13 (whose material in the portion in contact with a liquid was composed of SUS316 (stainless steel), SUS304 (stainless steel), and PTFE; produced by Advantec Co., Ltd.) and a PTFE-type membrane filter T050A013A (material: PTFE, pore diameter: 0.50 μm, filter diameter: 13 mm; produced by Advantec Co., Ltd.) attached to the holder KS-13, and using a glass syringe with a Luer lock, 3.0 mL of the liquid composition a was filtered over a period of 5 hours to obtain a liquid composition b.

Device Evaluation

On a glass substrate having a 45-nm-thick ITO film deposited thereon by sputtering, a 60-nm-thick film was formed by spin coating using ND-3202 (produced by Nissan Chemical Industries, Ltd.) as a hole injection material. The substrate thus coated was heated on a hot plate at 230° C. under an air atmosphere for 15 minutes.

Subsequently, polymer compound C was dissolved in xylene to prepare a 0.6 mass % xylene solution. Using this xylene solution, a 20-nm-thick film was formed on the hole injection layer by spin coating. The substrate thus coated was heated on a hot plate at 190° C. under a nitrogen gas atmosphere for 60 minutes.

The liquid composition b was applied by spin coating and then dried in a vacuum dryer at 5 Pa for 1 minute to form a film with a thickness of 80 nm. The coating film thus formed using the liquid composition b had no unevenness. The substrate thus coated was heated on a hot plate at 150° C. under a nitrogen gas atmosphere for 10 minutes and then subjected to vapor deposition to form sodium fluoride to a thickness of about 3 nm and then form aluminum to a thickness of about 100 nm as a cathode, thus producing a light-emitting device D1. The metal vapor deposition was started after the degree of vacuum had reached $1\times10^{-4}$ Pa or below.

When voltage was applied to the light-emitting device D1, green EL emission was obtained. The luminous efficiency at 1000 cd/m$^2$ was 49 cd/A. After the current value was set so that the initial luminance was 8000 cd/m$^2$, the light-emitting device was driven at a constant current and changes in luminance over time were measured. The time until the luminance reached 95% of the initial luminance was 6 hours.

Example 2

Preparation of Liquid Composition 6.9 parts by mass of light-emitting material A, 16.1 parts by mass of low-molecular-weight compound D, and 977 parts by mass of xylene containing 2,6-di-tert-butyl-4-methylphenol in a concentration of 100 ppm (on a mass basis) were mixed and dissolved to obtain a liquid composition d.

The liquid composition d was filtered in the same manner as in Example 1 to obtain a liquid composition e.

Device Evaluation

On a glass substrate having a 45-nm-thick ITO film deposited on it by sputtering, a 60-nm-thick film was formed by spin coating using ND-3202 (produced by Nissan Chemical Industries, Ltd.) as a hole injection material. The substrate thus coated was heated on a hot plate at 230° C. under an air atmosphere for 15 minutes.

Subsequently, polymer compound C was dissolved in xylene to prepare a 0.6 mass % xylene solution. Using this xylene solution, a 20-nm-thick film was formed on the hole injection layer by spin coating. The substrate thus coated was heated on a hot plate at 190° C. under a nitrogen gas atmosphere for 60 minutes.

The liquid composition e was applied by spin coating to form a film with a thickness of 80 nm. The coating film thus formed using the liquid composition e had no unevenness. The substrate thus coated was heated on a hot plate at 150° C. under a nitrogen gas atmosphere for 10 minutes and then subjected to vapor deposition to form sodium fluoride to a thickness of about 1.5 nm and then form aluminum to a thickness of about 100 nm as a cathode, thus producing a light-emitting device D2. The metal vapor deposition was started after the degree of vacuum had reached $1\times10^{-4}$ Pa or below.

When voltage was applied to the light-emitting device D2, green EL emission was obtained. The luminous efficiency at 1000 cd/m$^2$ was 8.7 cd/A. After the current value was set so that the initial luminance was 8000 cd/m$^2$, the light-emitting device was driven at a constant current and changes in luminance over time were measured. The time until the luminance reached 95% of the initial luminance was 60.3 hours.

Example 3

Preparation of Liquid Composition 6.9 parts by mass of light-emitting material A, 16.1 parts by mass of low-molecular-weight compound E, 776.7 parts by mass of cyclohexylbenzene containing 2,6-di-tert-butyl- 4-methylphenol in a concentration of 100 ppm (on a mass basis), and 200.3 parts by mass 4-methylanisole containing 2,6-di-t-butyl-4-methylphenol in a concentration of 100 ppm were mixed and dissolved to prepare a liquid composition g.

The liquid composition g was filtered in the same manner as in Example 1 to obtain a liquid composition h.

Device Evaluation

On a glass substrate having a 45-nm-thick ITO film deposited thereon by sputtering, a 60-nm-thick film was formed by spin coating using ND-3202 (produced by Nissan Chemical Industries, Ltd.) as a hole injection material. The substrate thus coated was heated on a hot plate at 230° C. under an air atmosphere for 15 minutes.

Subsequently, polymer compound C was dissolved in xylene to prepare a 0.6 mass % xylene solution. Using this xylene solution, a 20-nm-thick film was formed on the hole injection layer by spin coating. The substrate thus coated was heated on a hot plate at 190° C. under a nitrogen gas atmosphere for 60 minutes.

The liquid composition h was applied by spin coating and dried in a vacuum drier at 5 Pa for 1 minute to form a film with a thickness of 80 nm. The coating film thus formed using the liquid composition h had no unevenness. The substrate thus coated was heated on a hot plate at 180° C. under a nitrogen gas atmosphere for 10 minutes and then subjected to vapor deposition to form sodium fluoride to a thickness of about 1.5 nm and then form aluminum to a thickness of about 100 nm as a cathode, thus producing a light-emitting device D3. The metal vapor deposition was started after the degree of vacuum had reached $1\times10^{-4}$ Pa or below.

When voltage was applied to the light-emitting device D3, green EL emission was obtained. The luminous efficiency at 1000 cd/m$^2$ was 22.3 cd/A. After the current value was set so that the initial luminance was 8000 cd/m$^2$, the light-emitting device was driven at a constant current and changes in luminance over time were measured. The time until the luminance reached 95% of the initial luminance was 18.3 hours.

Example 4

Preparation of Liquid Composition 6.9 parts by mass of light-emitting material A, 16.1 parts by mass of low-molecular-weight compound F, and 977 parts by mass of 3-phenoxytoluene were mixed and dissolved to prepare a liquid composition j.

The liquid composition j was filtered in the same manner as in Example 1 to obtain a liquid composition k.

Device Evaluation

On a glass substrate having a 45-nm-thick ITO film deposited thereon by sputtering, a 60-nm-thick film was formed by spin coating using ND-3202 (produced by Nissan Chemical Industries, Ltd.) as a hole injection material. The substrate thus coated was heated on a hot plate at 230° C. under an air atmosphere for 15 minutes.

Subsequently, polymer compound C was dissolved in xylene to prepare a 0.6 mass % xylene solution. Using this xylene solution, a 20-nm-thick film was formed on the hole injection layer by spin-coating. The substrate thus coated was heated on a hot plate at 190° C. under a nitrogen gas atmosphere for 60 minutes.

The liquid composition k was applied by spin coating and dried in a vacuum drier at 5 Pa for 3 minutes to form a film with a thickness of 80 nm. The coating film thus formed using the liquid composition k had no unevenness. The substrate thus coated was heated on a hot plate at 180° C. under a nitrogen gas atmosphere for 10 minutes and then subjected to vapor deposition to form sodium fluoride to a thickness of about 1.5 nm and then aluminum to a thickness of about 100 nm as a cathode, thus producing a light-emitting device D4. The metal vapor deposition was started after the degree of vacuum had reached $1\times10^{-4}$ Pa or below.

When voltage was applied to the light-emitting device D4, green EL emission was obtained. The luminous efficiency at 1000 cd/m$^2$ was 42.6 cd/A. After the current value was set so that the initial luminance was 8000 cd/m$^2$, the light-emitting device was driven at a constant current and changes in luminance over time were measured. The time until the luminance reached 95% of the initial luminance was 16.1 hours.

Comparative Example 1

Preparation of Liquid Composition

A liquid composition c was obtained in the same manner as in Example 1 except that DISMIC® 13JP050AN (filter material: PTFE, housing material: polypropylene, pore diameter: 0.50 µm, filter diameter: 13 mm; produced by Advantec Co., Ltd.) was used in place of the filtering device comprising a stainless steel syringe holder KS-13 (produced by Advantec Co., Ltd.) and a PTFE-type membrane filter T050A013 (produced by Advantec Co., Ltd.) attached to the holder KS-13.

Device Evaluation

A light-emitting device CD1 was produced in the same manner as in Example 1 except that the liquid composition c was used in place of the liquid composition b.

When voltage was applied to the light-emitting device CD1, green EL emission was obtained. The luminous efficiency at 1000 cd/m$^2$ was 45 cd/A. After the current value was set so that the initial luminance was 8000 cd/m$^2$, the light-emitting device was driven at a constant current and changes in luminance over time were measured. The time until the luminance reached 95% of the initial luminance was 2 hours.

Comparative Example 2

Preparation of Liquid Composition

A liquid composition f was obtained in the same manner as in Example 2 except that DISMIC® 13JP050AN (filter material: PTFE, housing material: polypropylene, pore diameter: 0.50 µm, filter diameter: 13 mm; produced by Advantec Co., Ltd.) was used in place of the filtering device comprising a stainless steel syringe holder KS-13 (produced by Advantec Co., Ltd.) and a PTFE-type membrane filter T050A013 (produced by Advantec Co., Ltd.) attached to the holder KS-13.

Device Evaluation

A light-emitting device CD2 was produced in the same manner as in Example 2 except that the liquid composition f was used in place of the liquid composition e.

When voltage was applied to the light-emitting device CD2, green EL emission was obtained. The luminous efficiency at 1000 cd/m$^2$ was 8.3 cd/A. After the current value was set so that the initial luminance was 8000 cd/m$^2$, the light-emitting device was driven at a constant current and changes in luminance over time were measured. The time until the luminance reached 95% of the initial luminance was 26.7 hours.

Comparative Example 3

Preparation of Liquid Composition

A liquid composition i was obtained in the same manner as in Example 3 except that DISMIC® 13JP050AN (filter material: PTFE, housing material: polypropylene, pore diameter: 0.50 μm, filter diameter: 13 mm; produced by Advantec Co., Ltd.) was used in place of the filtering device comprising a stainless steel syringe holder KS-13 (produced by Advantec Co., Ltd.) and a PTFE-type membrane filter T050A013 (produced by Advantec Co., Ltd.) attached to the holder KS-13.

Device Evaluation

A light-emitting device CD3 was produced in the same manner as in Example 3 except that liquid composition i was used in place of the liquid composition h.

When voltage was applied to the light-emitting device CD3, green EL emission was obtained. The luminous efficiency at 1000 cd/m$^2$ was 22.0 cd/A. After the current value was set so that the initial luminance was 8000 cd/m$^2$, the light-emitting device was driven at a constant current and changes in luminance over time were measured. The time until the luminance reached 95% of the initial luminance was 9.6 hours.

Comparative Example 4

Preparation of Liquid Composition

A liquid composition l was obtained in the same manner as in Example 4 except that DISMIC® 13JP050AN (filter material: PTFE, housing material: polypropylene, pore diameter: 0.50 μm, filter diameter: 13 mm) (produced by Advantec Co., Ltd.) was used in place of the filtering device comprising a stainless steel syringe holder KS-13 (produced by Advantec Co., Ltd.) and a PTFE-type membrane filter T050A013 (produced by Advantec Co., Ltd.) attached to the holder KS-13.

Device Evaluation

A light-emitting device CD3 was produced in the same manner as in Example 4 except that the liquid composition l was used in place of the liquid composition k.

When voltage was applied to the light-emitting device CD4, green EL emission was obtained. The luminous efficiency at 1000 cd/m$^2$ was 45.0 cd/A. After the current value was set so that the initial luminance was 8000 cd/m$^2$, the light-emitting device was driven at a constant current and changes in luminance over time were measured. The time until the luminance reached 95% of the initial luminance was 8.9 hours.

EXPLANATION OF SYMBOLS

1: filtering device
2: housing
3: fluororesin membrane filter
4: filter support member

The invention claimed is:

1. A method for producing a liquid composition comprising a phosphorescent material and an organic solvent, the method comprising the steps of:
    dissolving a phosphorescent material in an organic solvent to prepare a mixed liquid, and
    filtering the mixed liquid obtained in the above step by a filtering device;
    wherein the filtering device comprises a housing or holder, a fluororesin membrane filter, and a filter support member;
    a material of a portion of the housing or holder which is in contact with the mixed liquid is a metal alone or a mixture of a metal and at least one member selected from the group consisting of glass, fluororesins and polyethylene which does not contain a phosphorus antioxidant or an oxidized phosphorus antioxidant; and
    a material of a portion of the filter support member which is in contact with the mixed liquid is at least one member selected from the group consisting of metals, glass, fluororesins and polyethylene which does not contain a phosphorus antioxidant or an oxidized phosphorus antioxidant.

2. The method for producing a liquid composition according to claim 1, wherein a material of the fluororesin membrane filter is polytetrafluoroethylene or polyvinylidene fluoride.

3. The method for producing a liquid composition according to claim 1, wherein the fluororesin membrane filter has a pore diameter of 0.01 μm or more and 1 μm or less.

4. The method for producing a liquid composition according to claim 1, wherein the material of a portion of the housing or holder which is in contact with the mixed liquid is a mixture of stainless steel and a fluororesin.

5. A method for producing a light-emitting device having electrodes comprising an anode and a cathode, and a light-emitting layer provided between the electrodes, the method comprising a step of applying a liquid composition produced by the method for producing a liquid composition according to claim 1 to form the light-emitting layer.

* * * * *